(12) United States Patent
Takeuchi

(10) Patent No.: US 7,821,863 B2
(45) Date of Patent: *Oct. 26, 2010

(54) VOLTAGE SUPPLY CIRCUIT AND SEMICONDUCTOR MEMORY

(75) Inventor: Atsushi Takeuchi, Kawasaki (JP)

(73) Assignee: Fujitsu Semiconductor Limited, Yokohama (JP)

( * ) Notice: Subject to any disclaimer, the term of this patent is extended or adjusted under 35 U.S.C. 154(b) by 0 days.

This patent is subject to a terminal disclaimer.

(21) Appl. No.: 12/261,916

(22) Filed: Oct. 30, 2008

(65) Prior Publication Data

US 2009/0086555 A1    Apr. 2, 2009

Related U.S. Application Data

(60) Continuation of application No. 11/712,424, filed on Mar. 1, 2007, now Pat. No. 7,460,416, which is a division of application No. 11/260,196, filed on Oct. 28, 2005, now Pat. No. 7,251,169.

(30) Foreign Application Priority Data

Jun. 27, 2005   (JP) .............................. 2005-186408

(51) Int. Cl.
G11C 7/00     (2006.01)
(52) U.S. Cl. .................... 365/226; 365/189.06; 365/203
(58) Field of Classification Search ............ 365/189.06, 365/226, 203; 327/530
See application file for complete search history.

(56) References Cited

U.S. PATENT DOCUMENTS

| 5,689,460 | A | 11/1997 | Ooishi |
| 6,265,858 | B1 | 7/2001 | Park |
| 6,462,584 | B1 | 10/2002 | Proebsting |
| 7,298,200 | B2 | 11/2007 | Won |
| 7,460,416 | B2 * | 12/2008 | Takeuchi ............... 365/189.09 |
| 2005/0117411 | A1 | 6/2005 | Koshikawa et al. |

FOREIGN PATENT DOCUMENTS

JP    2001-325792 A    11/2001

* cited by examiner

*Primary Examiner*—Hoai V Ho
(74) *Attorney, Agent, or Firm*—Arent Fox LLP

(57) ABSTRACT

Each of first and second differential amplifiers has a function of increasing a bias current in response to the activation of a drivability control signal. A first driving circuit connects an output node to a high power supply line in response to the activation of an output signal of the first differential amplifier, and connects the output node to a low power supply line in response to the activation of an output signal of the second differential amplifier. Only during the activation period of the drivability control signal, a second driving circuit connects the output node to the high power supply line in response to the activation of the output signal of the first differential amplifier, and connects the output node to the low power supply line in response to the activation of the output signal of the second differential amplifier.

12 Claims, 13 Drawing Sheets

VOLTAGE SUPPLY CIRCUIT AND SEMICONDUCTOR MEMORY

This application is a continuation of U.S. patent application Ser. No. 11/712,424, filed Mar. 1, 2007, now U.S. Pat. No. 7,460,416, which is a divisional of U.S. patent application Ser. No. 11/260,196, filed Oct. 28, 2005, now U.S. Pat. No. 7,251,169, which is based upon and claims the benefit of priority from Japanese Patent Application No. 2005-186408, filed on Jun. 27, 2005, the entire contents of which are incorporated herein by reference.

BACKGROUND OF THE INVENTION

1. Field of the Invention

The present invention relates to a voltage supply circuit supplying a bit-line precharging voltage in a semiconductor memory, such as a DRAM (Dynamic Random Access Memory) or the like.

2. Description of the Related Art

In general, a semiconductor memory, such as the DRAM or the like, has an internal power supply circuit that uses an external power supply voltage supplied through an external terminal to generate a plurality of internal power supply voltages. For example, the internal power supply circuit includes a plurality of voltage supply circuits, which supply a bit-line precharging voltage, a memory-cell plate voltage, a word-line activating voltage, a bit-line restoring voltage, and the like, respectively.

Here, the operation of a semiconductor memory, such as the DRAM or the like, will be briefly described. When a semiconductor memory changes from a standby state to an active state, a precharging control signal to a precharging circuit (a circuit that connects pair of bit lines to a precharging voltage line) and an equalizing control signal to an equalizing circuit (a circuit that connects the pair of bit lines with each other) are inactivated, and then a word line is activated. Accordingly, a precharging operation and an equalizing operation for the pair of bit lines stop, and a potential difference occurs between the pair of bit lines due to an electric charge accumulated in a memory cell. By potential difference being amplified by a sense amplifier, the voltage of one of the pair of bit lines and the voltage of the other bit line are set to a restoring voltage and a ground voltage, respectively.

Subsequently, when the semiconductor memory changes from the active state to the standby state, the word line is inactivated, and then the precharging control signal and the equalizing control signal are activated. Accordingly, the precharging operation and the equalizing operation for the pair of bit lines restart. Since one of the pair of bit lines and the other bit line have substantially the same electric load capacitance, the voltage of one of the pair of bit lines and the voltage of the other bit line are set to approximately half of the restoring voltage by the equalizing operation.

When the precharging voltage is set to a half of the restoring voltage, in the precharging operation after the restoring operation as described above, a current which has to be supplied by a voltage supply circuit for a precharging voltage barely exists. Further, when the precharging voltage is set to a half of the restoring voltage, in the precharging operation after a read operating or a write operation, the current which has to be supplied by the voltage supply circuit for a precharging voltage barely exists. As such, when the current which has to be supplied by the voltage supply circuit for a precharging voltage is constantly small regardless of the operation state of the semiconductor memory, drivability (current supply capacity) of the voltage supply circuit for a precharging voltage could be small.

In general, a push-pull-type voltage supply circuit is used as the voltage supply circuit for a precharging voltage. In the push-pull-type voltage supply circuit the output voltage is set substantially constant by an output node being connected to a restoring voltage line or a ground line through output transistors when an output voltage is deviated from a predetermined voltage range (dead zone). In such a push-pull-type voltage supply circuit, the output voltage is not influenced by threshold voltages of the output transistors, like a source-follower-type voltage supply circuit (for example, see Japanese Unexamined Patent Application Publication No. 2001-325792). For this reason, the push-pull-type voltage supply circuit can set the output voltage with higher precision, as compared to the source-follower-type voltage supply circuit. Further, the change in an output current in a voltage region neighboring the dead zone is precipitous in the push-pull-type voltage supply circuit. For this reason, the change in the output voltage depending on the output current is smaller in the push-pull-type voltage supply circuit, as compared to the source-follower-type voltage supply circuit.

On the other hand, there is a case in which the precharging voltage VPR is set lower than a half of the restoring voltage VBLH in order to improve a margin for reading out data of the sense amplifier. In this kind of case, the current which has to be supplied by the voltage supply circuit for a precharging voltage temporarily increases in the precharging operation after the restoring operation. The current $I_{VPR}$ in this case is expressed using load capacitance of one of the pair of bit lines $C_{BL}$, the number of sense amplifiers to be activated $N_{SA}$, and the activation period of each of the sense amplifiers $T_{CYC}$, as shown in the following equation (1).

$$I_{VPR} = \{(VBLH/2 - VPR) \cdot 2 \cdot C_{BL} \cdot N_{SA}\}/T_{CYC} \tag{1}$$

Further, when a voltage supply circuit for a restoring voltage is constituted using a source-follower circuit of nMOS transistors, the voltage of one of the pair of bit lines at the time of the end of the restoring operation increases as the restoring operation period extends. Even in this kind of case, the current which has to be supplied by the voltage supply circuit for a precharging voltage temporarily increases in the precharging operation after the restoring operation. The current $I_{VPR}$ in this case is expressed using the voltage of one of the pair of bit lines at the time of the end of the restoring operation VBLX, as shown in the following equation (2).

$$I_{VPR} = \{(VBLX/2 - VPR) \cdot 2 \cdot C_{BL} \cdot N_{SA}\}/T_{CYC} \tag{2}$$

As such, the voltage supply circuit for a precharging voltage is required to have large drivability when the current, which has to be supplied by the voltage supply circuit for a precharging voltage, temporarily increases according to the operation state of the semiconductor memory. In order to increase drivability of the push-pull-type voltage supply circuit, it is preferable to increase the cannel widths of the output transistors. However, when the channel widths of the output transistors increase, the load capacitance of the output terminal of each of differential amplifiers, which outputs control signals to the output transistors, increases. For this reason, the response speed against the change of the output voltage is lowered.

Further, in the push-pull-type voltage supply circuit, a feedback loop is formed by a two-stage amplifying circuit. Accordingly, when the channel widths of the output transistors increase, the stability against oscillation lowers, and thus causes oscillation to easily occur. The lowering of the response speed against the change of the output voltage and the lowering of stability against oscillation can be avoided by increasing bias currents of the differential amplifiers. However, when the bias currents of the differential amplifiers are constantly increased regardless of the operation state that the semiconductor memory is in, power consumption in the standby state of the semiconductor memory increases.

SUMMARY OF THE INVENTION

It is an object of the invention to control drivability of a voltage supply circuit for a precharging voltage according to an operation state of a semiconductor memory while ensuring a response speed against a change of an output voltage and stability against oscillation, without increasing power consumption in a standby state of the semiconductor memory.

According to a first aspect of the present invention, a semiconductor memory includes a plurality of memory cells, a plurality of pairs of bit lines that are correspondingly connected to the plurality of memory cells, a plurality of equalizing circuits that are provided to correspond to the plurality of pairs of bit lines, a plurality of precharging circuits that are provided to correspond to the plurality of pairs of bit lines in order to connect the plurality of pairs of bit lines to a precharging voltage line, a voltage supply circuit whose output node is connected to the precharging voltage line, and a control circuit that activates a drivability control signal to the voltage supply circuit when a current to be supplied to the precharging voltage line by the voltage supply circuit needs to be increased.

For example, the control circuit activates the drivability control signal in accordance with an activation timing of a row address strobe signal. Here, the row address strobe signal is a known control signal which is activated when the semiconductor memory changes from a standby state to an active state and is inactivated when the semiconductor memory changes from the active state to the standby state. Further, after the row address strobe signal is inactivated, the control circuit inactivates the drivability control signal in accordance with a timing at which a voltage of one of a pair of bit lines and a voltage of the other bit line are set to a precharging voltage.

A first differential amplifier in the voltage supply circuit receives a voltage of the output node and a first voltage as input voltages, and activates its output signal when the voltage of the output node is lower than the first voltage. A second differential amplifier in the voltage supply circuit receives the voltage of the output node and a second voltage which is higher than the first voltage as input voltages, and activates its output signal when the voltage of the output node is higher than the second voltage. A differential amplifying part of the each of the first and second differential amplifiers activates the output signal according to the magnitude relation between the input voltages. A current control part of the each of the first and second differential amplifiers is connected to the differential amplifying part, and increases a bias current in response to the activation of the drivability control signal.

A first driving circuit in the voltage supply circuit connects the output node to a high power supply line in response to the activation of the output signal of the first differential amplifier, and connects the output node to a low power supply line in response to the activation of the output signal of the second differential amplifier. A second driving circuit in the voltage supply circuit connects the output node to the high power supply line in response to the activation of the output signal of the first differential amplifier, and connects the output node to the low power supply line in response to the activation of the output signal of the second differential amplifier only during the activation period of the drivability control signal. Preferably, the voltage supply circuit further includes, in addition to the first and second differential amplifiers and the first and second driving circuits, a first and second switch circuit. A first switch circuit in the voltage supply circuit receives the output signal of the first differential amplifier, and transmits the output signal of the first differential amplifier to its output side by turning itself on in response to the activation of the drivability control signal. A second switch circuit in the voltage supply circuit receives the output signal of the second differential amplifier, and transmits the output signal of the second differential amplifier to its output side by turning itself on in response to the activation of the drivability control signal. The second driving circuit in the voltage supply circuit receives an output signal of the first switch circuit as the output signal of the first differential amplifier, and simultaneously receives an output signal of the second switch circuit as the output signal of the second differential amplifier. Hereinafter, the operation of the voltage supply circuit having such a configuration will be described.

During an inactivation period of the drivability control signal, when the voltage of the output node becomes lower than the first voltage, and the output signal of the first differential amplifier is activated, the first switch circuit is turned off, and thus only the first driving circuit connects the output node to the high power supply line. Accordingly, the voltage of the output node starts to rise. And, when the voltage of the output node becomes higher than the first voltage, the output signal of the first differential amplifier is inactivated, and then the first driving circuit disconnects the output node from the high power supply line. Further, during the inactivation period of the drivability control signal, when the voltage of the output node becomes higher than the second voltage and the output signal of the second differential amplifier is activated, the second switch circuit is turned off, and thus only the first driving circuit connects the output node to the low power supply line. Accordingly, the voltage of the output node starts to fall. And, when the voltage of the output node becomes lower than the second voltage, the output signal of the second differential amplifier is inactivated, and the first driving circuit disconnects the output node from the low power supply line.

On the other hand, during the activation period of the drivability control signal, when the voltage of the output node become lower than the first voltage, and the output signal of the first differential amplifier is activated, the first switch circuit is turned on, and thus both the first and second driving circuits connect the output node to the high power supply line. Accordingly, the voltage of the output node starts to rise. And, when the voltage of the output node become higher than the first voltage, the output signal of the first differential amplifier is inactivated, and the first and second driving circuits disconnect the output node from the high power supply line. Further, during the activation period of the drivability control signal, when the voltage of the output node becomes higher than the second voltage and the output signal of the second differential amplifier is activated, the second switch circuit is turned on, and thus both the first and second driving circuits connect the output node to the low power supply line. Accordingly, the voltage of the output node starts to fall. And, when the voltage of the output node becomes lower than the second voltage, the output signal of the second differential amplifier is inactivated, and thus the first and second driving circuits disconnect the output node from the low power supply line.

As described above, in the voltage supply circuit, drivability increases during the activation period of the drivability control signal and decreases during the inactivation period of the drivability control signal. That is, drivability of the voltage supply circuit can be controlled by the drivability control signal. For this reason, when the current which has to be supplied by the voltage supply circuit is temporarily increased according to the operation state of the semiconductor memory (for example, the precharging voltage is set lower than a half of the restoring voltage), drivability required for the voltage supply circuit can be obtained by activating the drivability control signal during a period where there should be a large current supplied by the voltage supply circuit.

Further, since the voltage supply circuit is a push-pull type, when both the first and second driving circuits are operated during the activation period of the drivability control signal, lowering of a response speed against a change of an output voltage and lowering of stability against oscillation may occur. However, since the bias currents of the first and second differential amplifiers are increased during the activation period of the drivability control signal, the response speed against the change of the output voltage and stability against oscillation can be ensured during the activation period of the drivability control signal.

During the inactivation period of the drivability control signal, the first switch circuit is turned off, and thus an output terminal of the first differential amplifier is electrically disconnected from an input terminal of the second driving circuit, through which the output signal of the first switch circuit is received. Similarly, during the inactivation period of the drivability control signal, the second switch circuit is turned off, and thus an output terminal of the second differential amplifier is electrically disconnected from an input terminal of the second driving circuit, through which the output signal of the second switch circuit is received. Therefore, the response speed against the change of the output voltage during the inactivation period of the drivability control signal due to the second driving circuit can be prevented from being lowered. In addition, during the inactivation period of the drivability control signal, the second driving circuit does not operate, and the bias currents of the first and second differential amplifiers become small. Therefore, an increase of power consumption in the standby state of the semiconductor memory can be avoided.

In a preferable example of the first aspect of the present invention, the first driving circuit includes a first transistor that is provided between the high power supply line and the output node and a second transistor that is provided between the low power supply line and the output node. A control terminal of the first transistor receives the output signal of the first differential amplifier. A control terminal of the second transistor receives the output signal of the second differential amplifier. The second driving circuit includes a third transistor that is provided between the high power supply line and the output node, a fourth transistor that is provided between the low power supply line and the output node, a fifth transistor that is provided between the high power supply line and the third transistor, and a sixth transistor that is provided between the low power supply line and the fourth transistor. A control terminal of the third transistor receives the output signal of the first switch circuit. A control terminal of the fourth transistor receives the output signal of the second switch circuit. A control terminal of the fifth transistor receives the drivability control signal. A control terminal of the sixth transistor receives the drivability control signal. The first and second driving circuits can be easily formed with these configurations. Further, since the fifth and sixth transistors are provided, a leak current in the second driving circuit in the inactivation period of the drivability control signal can be reduced, and thus power consumption in the standby state of the semiconductor memory can be reduced.

In a preferable example of the first aspect of the present invention, the channel width of each of the third to sixth transistors in the second driving circuit are larger than the channel width of each of the first and second transistors in the first driving circuit. In general, the current which has to be supplied by the voltage supply circuit during the activation period of the drivability control signal is significantly larger than the current which has to be supplied by the voltage supply circuit during the inactivation period of the drivability control signal. Accordingly, large drivability required for the voltage supply circuit during the activation period of the drivability control signal can be obtained by making the channel width of each of the third to sixth transistors larger than the channel width of each of the first and second transistors.

In a preferable example of the first aspect of the present invention, each of the first and second switch circuits include first and second switches that are provided in parallel between its input and its output. The first switch turns on in response to the activation of the drivability control signal. The second switch turns on in response to the inactivation of the drivability control signal. An impedance of the second switch is higher than an impedance of the first switch.

For this reason, during the inactivation period of the drivability control signal, the output terminal of the first differential amplifier and the input terminal of the second driving circuit through which the output signal of the first switch circuit is received are electrically connected to each other very weakly. As a result, the voltage of the input terminal in the second driving circuit through which the output signal of the first switch circuit is received and the voltage of the output terminal of the first differential amplifier can be prevented from separating, even when the inactivation period of the drivability control signal is extended. Similarly, during the inactivation period of the drivability control signal, the output terminal of the second differential amplifier and the input terminal of the second driving circuit through which the output signal of the second switch circuit is received are electrically connected to each other very weakly. For this reason, the voltage of the input terminal in the second driving circuit through which the output signal of the second switch circuit is received and the voltage of the output terminal of the second differential amplifier can be prevented from separating, even when the inactivation period of the drivability control signal is extended. Therefore, the response speed against the change of the output voltage, just after the activation of the drivability control signal, can be improved.

In a preferable example of the first aspect of the present invention, the current control part in each of the first and second differential amplifiers include first and second current sources that are provided in parallel with respect to the differential amplifying part, and a current control switch that is provided between the differential amplifying part and the second current source. The current control switch turns on in response to the activation of the drivability control signal. Accordingly, the first current source is constantly valid regardless of the drivability control signal, while the second current source is valid only during the activation period of the drivability control signal. For this reason, the bias current of each of the first and second differential amplifiers increases in response to the activation of the drivability control signal, and decreases in response to the inactivation of the drivability control signal. The current control part in each of the first and second differential amplifiers can be easily formed with these configurations.

According to a second aspect of the present invention, similarly to the first aspect of the present invention, a semiconductor memory includes a plurality of memory cells, a plurality of pairs of bit lines, a plurality of equalizing circuits, a plurality of precharging circuits, a voltage supply circuit, and a control circuit. Here, the voltage supply circuit is composed of first and second voltage supply parts that are provided in parallel with respect to an output node. A first differential amplifier of the first voltage supply part receives the voltage of the output node and a first voltage as input voltages, and activates its output signal when the voltage of the output node is lower than the first voltage. A second differential amplifier of the first voltage supply part receives the voltage of the output node and a second voltage which is higher than the first voltage as input voltages, and activates its output signal when the voltage of the output node is higher than the second voltage. A first driving circuit of the first voltage supply part connects the output node to a high power supply line in response to the activation of the output signal of the first differential amplifier, and connects the output node to a low power supply line in response to the activation of the output signal of the second differential amplifier.

A third differential amplifier of the second voltage supply part receives the voltage of the output node and the first voltage as input voltages, and activates its output signal when the voltage of the output node is lower than the first voltage. A fourth differential amplifier of the second voltage supply part receives the voltage of the output node and the second voltage as input voltages, and, only during an activation period of a drivability control signal, activates its output signal when the voltage of the output node is higher than the second voltage. A second driving circuit of the second voltage supply part, only during the activation period of the drivability control signal, connects the output node to the high power supply line in response to the activation of the output signal of the third differential amplifier, and connects the output node to the low power supply line in response to the activation of the output signal of the fourth differential amplifier. Hereinafter, the operation of the voltage supply circuit having such a configuration will be described.

During an inactivation period of the drivability control signal, when the voltage of the output node becomes lower than the first voltage, only the output signal of the first differential amplifier is activated, and thus only the first driving circuit connects the output node to the high power supply line. Accordingly, the voltage of the output node starts to rise. And, when the voltage of the output node becomes higher than the first voltage, the output signal of the first differential amplifier is inactivated, and then the first driving circuit disconnects the output node from the high power supply line. Further, in the inactivation period of the drivability control signal, when the voltage of the output node becomes higher than the second voltage, only the output signal of the second differential amplifier is activated, and thus only the first driving circuit connects the output node to the low power supply line. Accordingly, the voltage of the output node starts to fall. And, when the voltage of the output node becomes lower than the second voltage, the output signal of the second differential amplifier is inactivated, and then the first driving circuit disconnects the output node from the low power supply line.

On the other hand, during the activation period of the drivability control signal, when the voltage of the output node becomes lower than the first voltage, both the output signal of the first differential amplifier and the output signal of the third differential amplifier are activated, and thus both the first and second driving circuits connect the output node to the high power supply line. Accordingly, the voltage of the output node starts to rise. And, when the voltage of the output node becomes higher than the first voltage, the output signal of the first differential amplifier and the output signal of the third differential amplifier are inactivated, and then the first and second driving circuits disconnect the output node from the high power supply line. Further, during the activation of the drivability control signal, when the voltage of the output node becomes higher than the second voltage, both the output signal of the second differential amplifier and the output signal of the fourth differential amplifier are activated, and thus both the first and second driving circuits connect the output node to the low power supply line. Accordingly, the voltage of the output node starts to fall. And, when the voltage of the output node becomes lower than the second voltage, the output signal of the second differential amplifier and the output signal of the fourth differential amplifier are inactivated, and then the first and second driving circuits disconnect the output node from the low power supply line.

As described above, in the voltage supply circuit, drivability is increased during the activation period of the drivability control signal and is decreased during the inactivation period of the drivability control signal. That is, drivability of the voltage supply circuit can be controlled by the drivability control signal. For this reason, similarly to the first aspect of the present invention, when the current which has to be supplied by the voltage supply circuit is temporarily increased according to the operation state of the semiconductor memory, the response speed against the change of the output voltage and stability against oscillation can be ensured during the activation period of the drivability control signal. Further, during the inactivation period of the drivability control signal, the third and fourth differential amplifiers and the second driving circuit in the second voltage supply part do not operate, and thus an increase of power consumption in the standby state of the semiconductor memory can be avoided.

In a preferable example of the second aspect of the present invention, the first driving circuit includes a first transistor that is provided between the high power supply line and the output node and a second transistor that is provided between the low power supply line and the output node. A control terminal of the first transistor receives the output signal of the first differential amplifier. A control terminal of the second transistor receives the output signal of the second differential amplifier. The second driving circuit includes a third transistor that is provided between the high power supply line and the output node, a fourth transistor that is provided between the low power supply line and the output node, a fifth transistor that is provided between the high power supply line and the third transistor, and a sixth transistor that is provided between the low power supply line and the fourth transistor. A control terminal of the third transistor receives the output signal of the third differential amplifier. A control terminal of the fourth transistor receives the output signal of the fourth differential amplifier. A control terminal of the fifth transistor receives the drivability control signal. A control terminal of the sixth transistor receives the drivability control signal. The first and second driving circuits can be easily constituted with these configurations. Further, since the fifth and sixth transistors are provided, a leak current in the second driving circuit in the inactivation period of the drivability control signal can be reduced, and thus power consumption in the standby state of the semiconductor memory can be reduced.

BRIEF DESCRIPTION OF THE DRAWINGS

The nature, principle, and utility of the invention will become more apparent from the following detailed description when read in conjunction with the accompanying drawings in which like parts are designated by identical reference numerals, in which.

DESCRIPTION OF THE PREFERRED EMBODIMENTS

Figure 1:
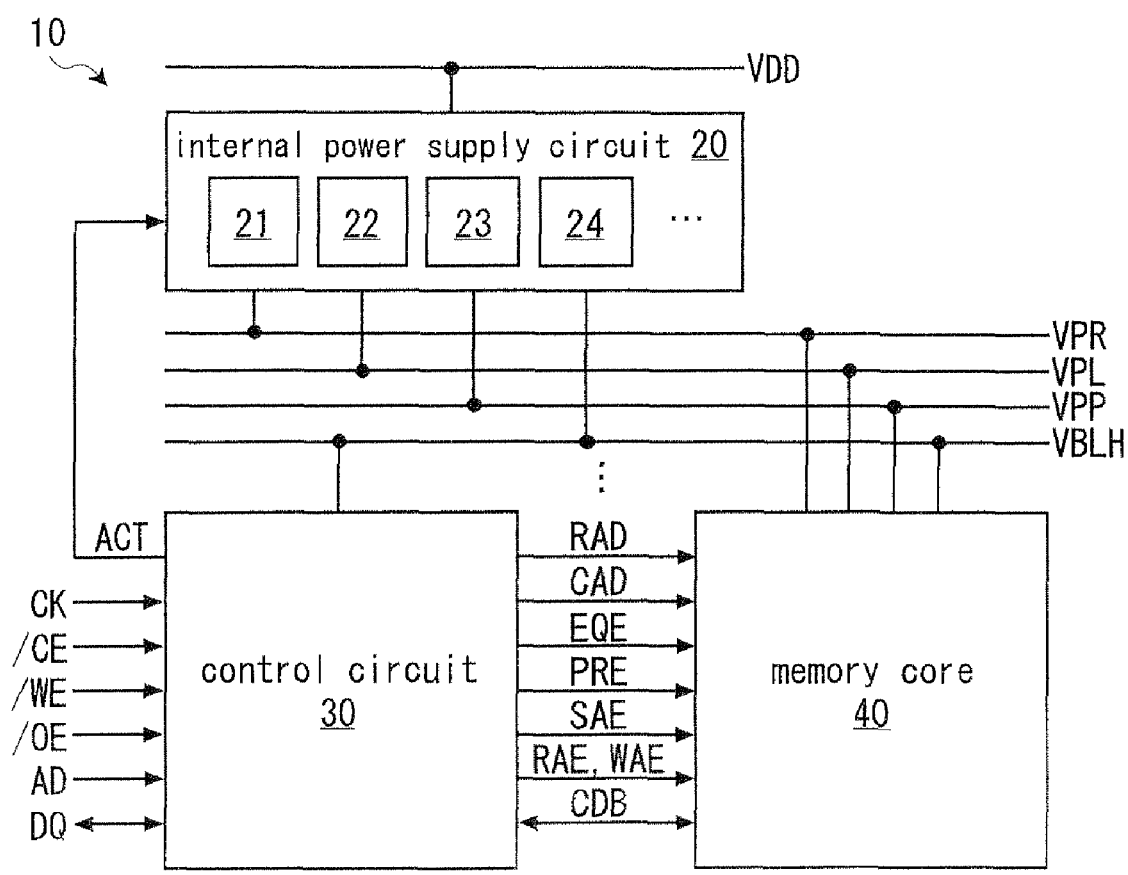
FIG. 1 is a block diagram showing a first embodiment of the invention.
Figure 2:
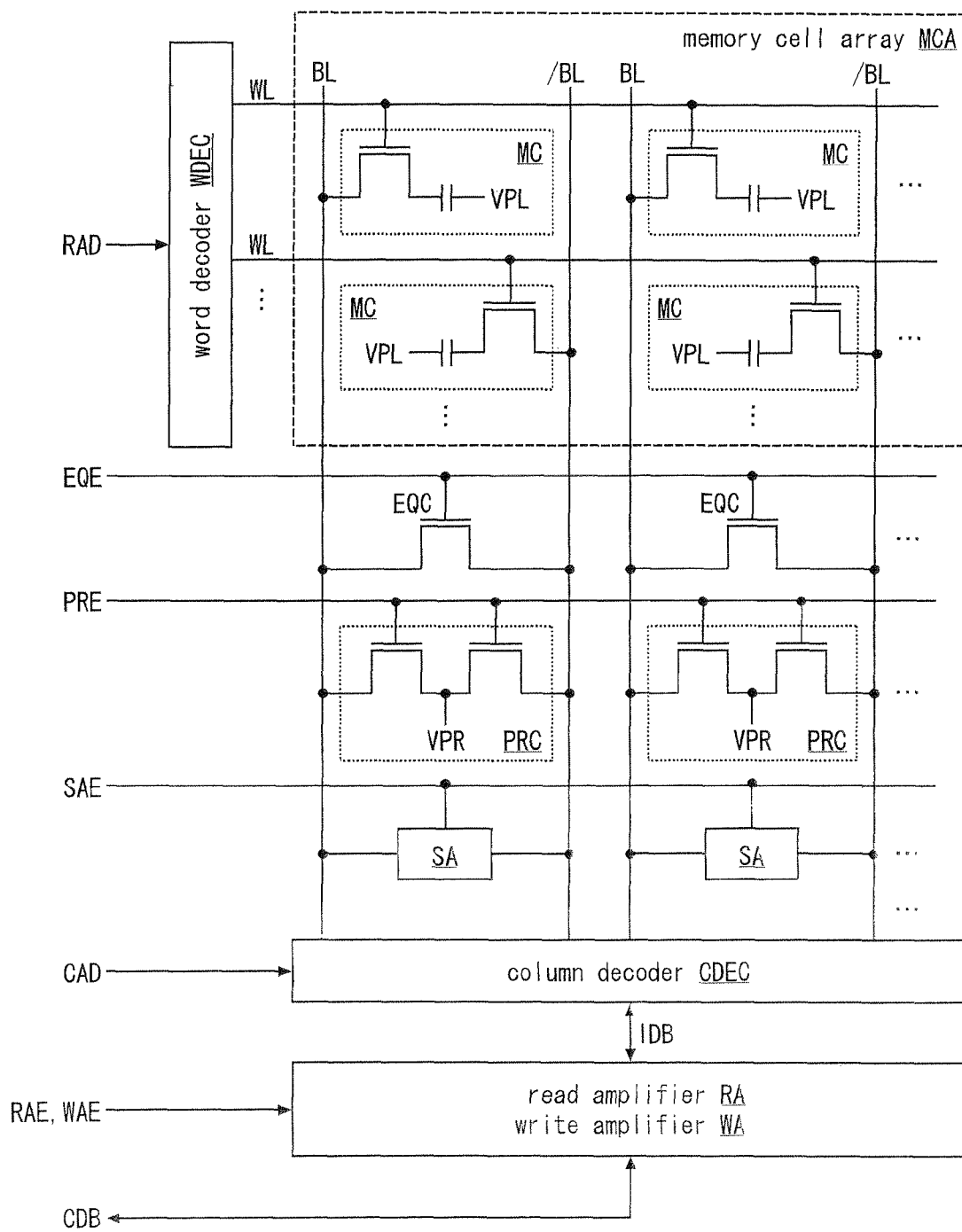
FIG. 2 is a block diagram showing a memory core of FIG. 1.

Hereinafter, embodiments of the invention will be described with reference to the drawings. Moreover, each voltage line and a voltage to be supplied thereto are represented by the same reference numeral. FIG. 1 shows a first embodiment of the invention. FIG. 2 shows a memory core of FIG. 1. In FIG. 1, a semiconductor memory 10 is, for example, a DRAM, and has an internal power supply circuit 20, a control circuit 30, and a memory core 40. The internal power supply circuit 20 is a circuit that generates a plurality of internal power supply voltages by use of an external power supply voltage VDD to be supplied through an external terminal. The internal power supply circuit 20 has a plurality of voltage supply circuits including a voltage supply circuit 21 that supplies a voltage to a precharging voltage line VPR, a voltage supply circuit 22 that supplies a voltage to a plate voltage line VPL, a voltage supply circuit 23 that supplies a voltage to a word-line activating voltage line VPP, and a voltage supply circuit 24 that supplies a voltage to a restoring voltage line VBLH. In the voltage supply circuit 21, drivability (current supply capacity with respect to the precharging voltage line VPR) is increased in response to the activation of an activating signal ACT (drivability control signal) from the control circuit 30, and drivability is decreased in response to the inactivation of the activating signal ACT.

The control circuit 30 generates control signals to the memory core 40 (a multiple-bit row address signal RAD, a multi-bit column address signal CAD, an equalizing control signal EQE, a precharging control signal PRE, a sense amplifier control signal SAE, a read amplifier control signal RAE, and a write amplifier control signal WAE) on the basis of a clock signal CK, a chip enable signal /CE, a write enable signal /WE, an output enable signal /OE, and a multi-bit address signal AD. In a read operation period, the control circuit 30 takes in a multi-bit data signal DQ and outputs that to a multi-bit common data bus CDB. In a write operation period, the control circuit 30 takes in a data signal on the common data bus CDB and outputs that as the data signal DQ.

Further, the control circuit 30 activates the activating signal ACT for controlling drivability of the voltage supply circuit 21 in the internal power supply circuit 20 in accordance with an activation timing of a row address strobe signal RAS (not shown). The row address strobe signal RAS is a known control signal, which is activated when the semiconductor memory 10 changes from a standby state to an active state, and is inactivated when the semiconductor memory 10 changes from the active state to the standby state. Further, after the row address strobe signal RAS is inactivated, the control circuit 30 inactivates the activating signal ACT in accordance with a timing at which a voltage of one of a pair of bit lines and a voltage of the other bit line in the memory core 40 are set to a precharging voltage.

In FIG. 2, the memory core 40 has a memory cell array MCA, a plurality of equalizing circuits EQC, a plurality of precharging circuits PRC, a plurality of sense amplifiers SA, a word decoder WDEC, a column decoder CDEC, a read amplifier RA, and a write amplifier WA. The memory cell array MCA has a plurality of memory cells MC that are disposed at intersections between a plurality of word lines WL and a plurality of bit lines BL and /BL. Each of the memory cells MC is a dynamic memory cell, and has a transfer transistor and a capacitor, which are connected in series between the corresponding bit line BL (or bit line /BL) and the plate voltage line VPL. A gate of the transfer transistor of each memory cell MC is connected to the corresponding word line WL.

The plurality of equalizing circuits EQC are provided to correspond to a plurality of pairs of bit lines BL and /BL. Each equalizing circuit EQC has an nMOS transistor that is connected between the corresponding pair of bit lines BL and /BL, and receives the equalizing control signal EQE at its gate. The plurality of precharging circuits PRC are provided to correspond to the plurality of pairs of bit lines BL and /BL. Each precharging circuit PRC has a pair of nMOS transistors that are connected in series between the corresponding pair of bit lines BL and /BL, and receive the precharging control signal PRE at their gates. A connection node of the pair of nMOS transistors in each precharging circuit PRC is connected to the precharging voltage line VPR. The plurality of sense amplifiers SA are provided to correspond to the plurality of pairs of bit lines BL and /BL. Each sense amplifier SA amplifies a potential difference of the corresponding pair of bit lines BL and /BL in response to the activation of the sense amplifier control signal SAE.

The word decoder WDEC activates one of the plurality of word lines WL according to the row address signal RAD. The column decoder CDEC selects a predetermined number of pairs of bit lines BL and /BL according to the column address signal CAD, and connects the selected pairs of bit lines BL and /BL to a multi-bit internal data bus IDB. In the activation period of the read amplifier control signal RAE (read operation period), the read amplifier RA amplifies the data signal on the internal data bus IDB and outputs the amplified data signal to the common data bus CDB. In the activation period of the write amplifier control signal WAE (write operation period), the write amplifier WA amplifies the data signal on the common data bus CDB and outputs the amplified data signal to the internal data bus IDB.

Figure 3:
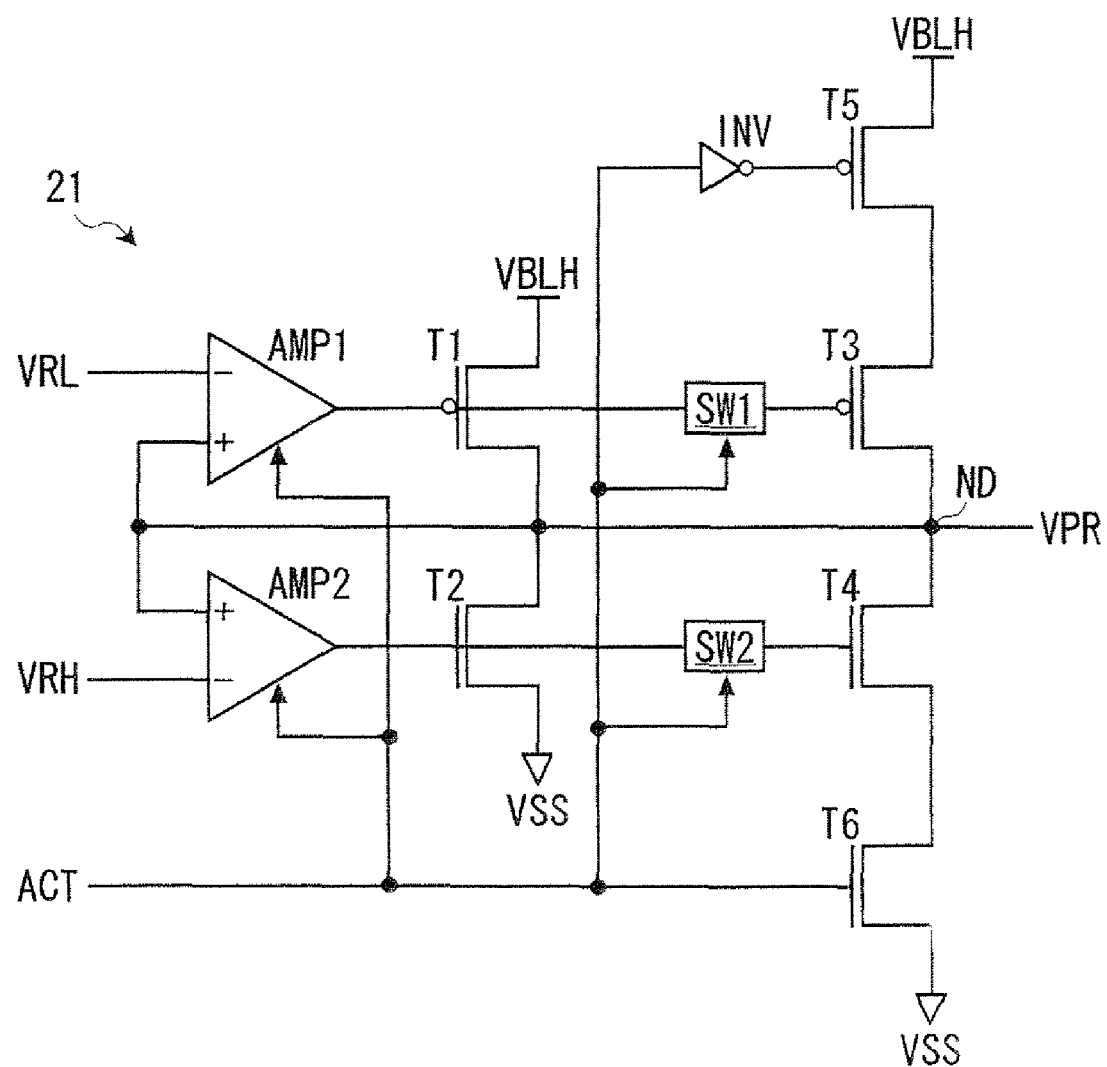
FIG. 3 is a circuit diagram showing a voltage supply circuit for a precharging voltage of FIG. 1.
Figure 4:
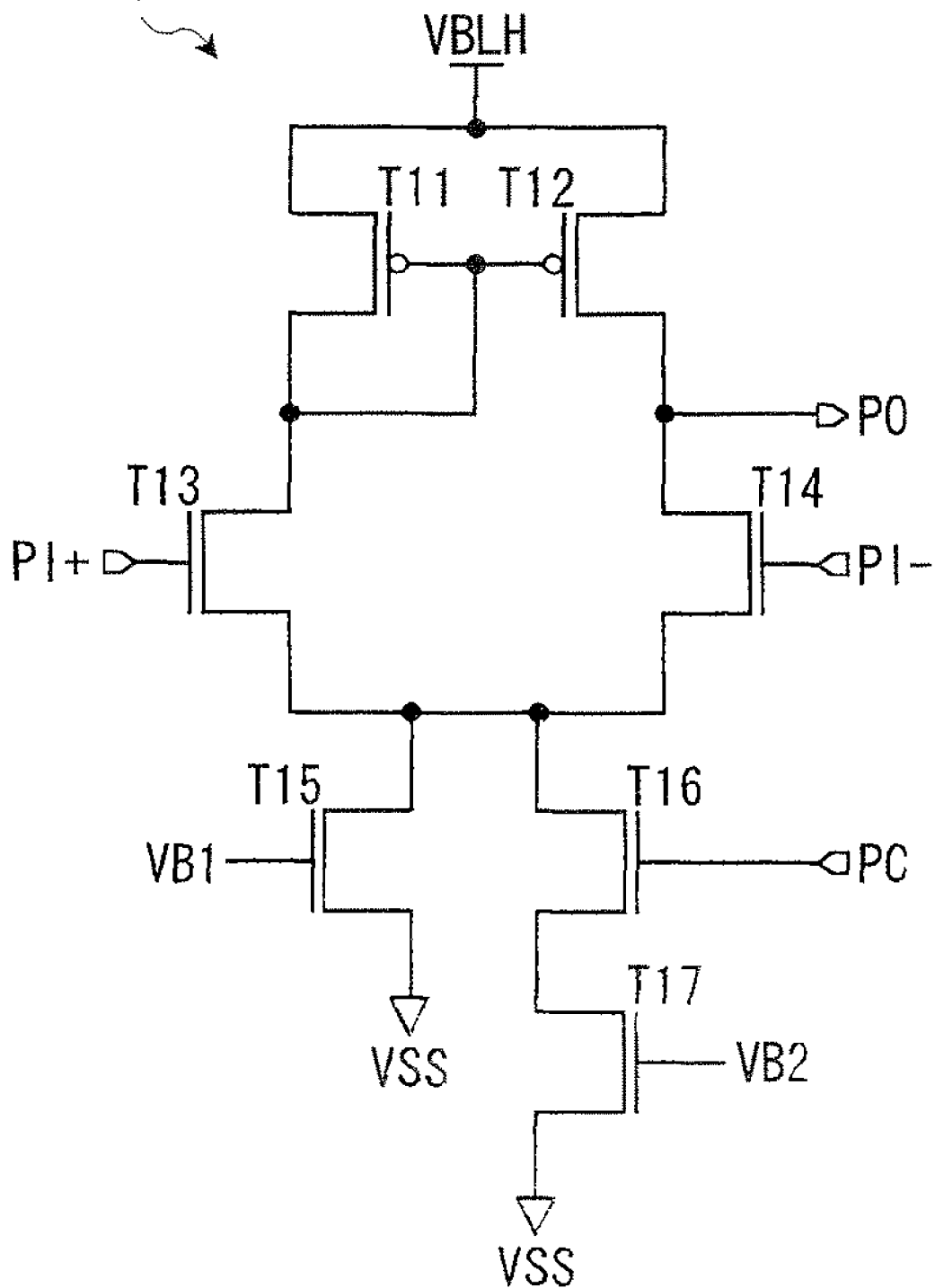
FIG. 4 is a circuit diagram showing differential amplifiers of FIG. 3.
Figure 5:
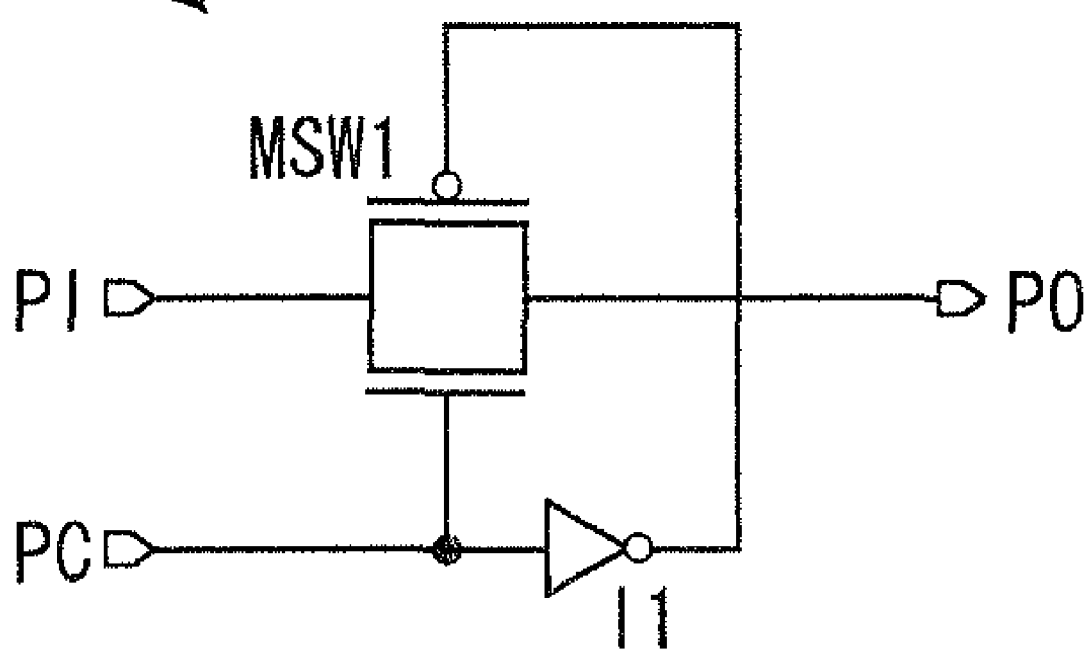
FIG. 5 is a circuit diagram showing switch circuits of FIG. 3.

FIG. 3 shows a voltage supply circuit for a precharging voltage of FIG. 1. FIG. 4 shows differential amplifiers of FIG. 3. FIG. 5 shows switch circuits of FIG. 3. In FIG. 3, the voltage supply circuit 21 for a precharging voltage is a pushpull-type voltage supply circuit, and has differential amplifiers AMP1 and AMP2 (first and second differential amplifiers), a pMOS transistor T1 and an nMOS transistor T2 (first driving circuit), switch circuits SW1 and SW2 (first and second switch circuits), an inverter INV, and pMOS transistors T3 and T5 and nMOS transistors T4 and T6 (second driving circuit).

As shown in FIG. 4, each of the differential amplifiers AMP1 and AMP2 has pMOS transistors T11 and T12, nMOS transistors T13 and T14 (differential amplifying part), and nMOS transistors T15 to T17 (current control part). A source of the pMOS transistor T11 and a source of the pMOS transistor T12 are connected to a restoring voltage line VBLH (high power supply line). A gate of the pMOS transistor T11, a drain of the pMOS transistor T11, a gate of the pMOS transistor T12, and a drain of the nMOS transistor T13 are connected to one another. A drain of the pMOS transistor T12 and a drain of the nMOS transistor T14 are connected to each other. A connection node of the drain of the pMOS transistor T12 and the drain of the nMOS transistor T14 is connected to an output terminal PO. A gate of the nMOS transistor T13 is connected to a non-inverting input terminal PI+. A gate of the nMOS transistor T14 is connected to an inverting input terminal PI−.

A source of the nMOS transistor T13 and a source of the nMOS transistor T14, a drain of an nMOS transistor T15, and a drain of an nMOS transistor T16 are connected to one another. A source of the nMOS transistor T15 is connected to a ground line VSS (low power supply line). A source of the nMOS transistor T16 and a drain of an nMOS transistor T17 are connected to each other. A source of the nMOS transistor T17 is connected to the ground line VSS. A gate of the nMOS transistor T15 receives a bias voltage VB1. A gate of the nMOS transistor T16 is connected to a control terminal PC. A gate of the nMOS transistor T17 receives a bias voltage VB2. Moreover, the bias voltage VB2 is set to be higher than the bias voltage VB1.

In such a circuit configuration, an output signal from the output terminal PO is set to a low level (voltage VSS) when an input voltage to the non-inverting input terminal PI+ is lower than an input voltage to the inverting input terminal PI−, and is set to a high level (voltage VBLH) when the input voltage to the non-inverting input terminal PI+ is higher than the input voltage to the inverting input terminal PI−. Further, the nMOS transistor T15 (first current source) is constantly valid as a current source regardless of an input signal to the control terminal PC. On the other hand, the nMOS transistor T17 (second current source) is valid as a current source only when the nMOS transistor T16 (current control switch) is turned on, that is, only when the input signal to the control terminal PC is set to the high level. Therefore, in the above-described circuit configuration, a bias current is increased in response to a rising transition of the input signal to the control terminal PC, and is decreased in response to a falling transition of the input signal to the control terminal PC.

In FIG. 3, the differential amplifier AMP1 receives an output voltage VPR (the voltage of the output node ND) through the non-inverting input terminal PI+, and simultaneously receives a reference voltage VRL (first voltage) through the inverting input terminal PI−. Therefore, the output signal of the differential amplifier AMP1 is activated to the low level when the output voltage VPR is lower than the reference voltage VRL. Further, the differential amplifier AMP2 receives the output voltage VPR through the non-inverting input terminal PI+, and simultaneously receives a reference voltage VRH (second voltage) through the inverting input terminal PI−. Therefore, the output signal of the differential amplifier AMP2 is activated to the high level when the output voltage VPR is higher than the reference voltage VRH. Moreover, the reference voltage VRH is set to be higher than the reference voltage VRL. Further, each of the differential amplifiers AMP1 and AMP2 receives the activating signal ACT through the control terminal PC. Therefore, in each of the differential amplifiers AMP1 and AMP2, the bias current is increased in response to the activation of the activating signal ACT to the high level, and is decreased in response to the inactivation of the activating signal ACT to the low level.

A drain of the PMOS transistor T1 is connected to the output node ND, which is connected to the precharging voltage line VPR. A source of the PMOS transistor T1 is connected to the restoring voltage line VBLH. A gate of the PMOS transistor T1 is connected to the output terminal PO of the differential amplifier AMP1. A drain of the nMOS transistor T2 is connected to the output node ND. A source of the nMOS transistor T2 is connected to the ground line VSS. A gate of the nMOS transistor T2 is connected to the output terminal PO of the differential amplifier AMP2.

As shown in FIG. 5, each of the switch circuits SW1 and SW2 has a CMOS switch MSW1 and an inverter I1. One end and the other end of the CMOS switch MSW1 are connected to the input terminal PI and the output terminal PO, respectively. The input of the inverter I1 is connected to the control terminal PC. A gate of a pMOS transistor constituting the CMOS switch MSW1 is connected to the output of the inverter I1. A gate of an nMOS transistor constituting the CMOS switch MSW1 is connected to the control terminal PC. In such a circuit configuration, when the input signal to the control terminal PC is set to the high level, the CMOS switch MSW1 is turned on, and thus the input terminal PI and the output terminal PO are electrically connected to each other. On the other hand, when the input signal to the control terminal PC is set to the low level, the CMOS switch MSW1 is turned off, the input terminal PI and the output terminal PO are electrically disconnected from each other.

Referring to FIG. 3, in the switch circuit SW1, the input terminal PI is connected to the output terminal PO of the differential amplifier AMP1 and the output terminal PO is connected to a gate of the PMOS transistor T3. In the switch circuit SW2, the input terminal PI is connected to the output terminal PO of the differential amplifier AMP2 and the output terminal PO is connected to a gate of the nMOS transistor T4. The switch circuits SW1 and SW2 receive the activating signal ACT through the control terminals PC. Accordingly, in the activation period of the activating signal ACT to the high level, the CMOS switches MSW1 of the switch circuits SW1 and SW2 are turned on. Therefore, the output terminal PO of the differential amplifier AMP1 and the gate of the pMOS transistor T3 are electrically connected to each other, and simultaneously the output terminal PO of the differential amplifier AMP2 and the gate of the nMOS transistor T4 are electrically connected to each other. On the other hand, in the inactivation period of the activating signal ACT to the low level, the CMOS switches MSW1 of the switch circuits SW1 and SW2 are turned off. Then, the output terminal PO of the differential amplifier AMP1 and the gate of the pMOS transistor T3 are electrically disconnected from each other, and simultaneously the output terminal PO of the differential amplifier AMP2 and the gate of the nMOS transistor T4 are electrically disconnected from each other.

A drain of the pMOS transistor T3 is connected to the output node ND. A source of the pMOS transistor T3 and a drain of the pMOS transistor T5 are connected to each other. A source of the pMOS transistor T5 is connected to the restoring voltage line VBLH. As described above, the gate of the pMOS transistor T3 is connected to the output terminal PO of the switch circuit SW1. A gate of the pMOS transistor T5 receives the activating signal ACT through the inverter INV.

A drain of the nMOS transistor T4 is connected to the output node ND. A source of the nMOS transistor T4 and a drain of the nMOS transistor T6 are connected to each other. A source of the nMOS transistor T6 is connected to the ground line VSS. As described above, the gate of the nMOS transistor T4 is connected to the output terminal PO of the switch circuit SW2. A gate of the nMOS transistor T6 receives the activating signal ACT. Moreover, the channel width of each of the pMOS transistors T3 and T5 and the nMOS transistors T4 and T6 is larger than the channel width of each of the pMOS transistor T1 and the nMOS transistor T2. Hereinafter, the operation of the voltage supply circuit 21 having such a configuration will be described while being divided into the inactivation period and the activation period of the activating signal ACT.

(Inactivation Period of Activating Signal Act)

If the output voltage VPR becomes lower than the reference voltage VRL, the output signal of the differential amplifier AMP1 is activated to the low level. Moreover, since the activating signal ACT is inactivated, the differential amplifiers AMP1 and AMP2 operate with a small bias current. In the inactivation period of the activating signal ACT, the CMOS switch MSW1 of the switch circuit SW1 is turned off, and thus the output terminal PO of the differential amplifier AMP1 and the gate of the pMOS transistor T3 are electrically disconnected from each other. For this reason, in accordance with the activation of the output signal of the differential amplifier AMP1, only the pMOS transistor T1 is turned on. Therefore, the supply of a current starts between the output node ND and the restoring voltage line VBLH only through the pMOS transistor T1. Accordingly, the output voltage VPR starts to rise. Then, if the output voltage VPR becomes higher than the reference voltage VRL, the output signal of the differential amplifier AMP1 is inactivated to the high level. If doing so, the pMOS transistor T1 is turned off, and then the supply of the current stops between the output node ND and the restoring voltage line VBLH.

On the other hand, if the output voltage VPR becomes higher than the reference voltage VRH, the output signal of the differential amplifier AMP2 is activated to the high level. In the inactivation period of the activating signal ACT, the CMOS switch MSW1 of the switch circuit SW2 is turned off, and thus the output terminal PO of the differential amplifier AMP2 and the gate of the nMOS transistor T4 are electrically disconnected from each other. For this reason, in accordance with the activation of the output signal of the differential amplifier AMP2, only the nMOS transistor T2 is turned on. Therefore, the supply of a current starts between the output node ND and the ground line VSS only through the nMOS transistor T2. Accordingly, the output voltage VPR starts to fall. Then, if the output voltage VPR becomes lower than the reference voltage VRH, the output signal of the differential amplifier AMP2 is inactivated to the low level. If doing so, the nMOS transistor T2 is turned off, and then the supply of the current stops between the output node ND and the ground line VSS.

(Activation Period of Activating Signal Act)

If the output voltage VPR becomes lower than the reference voltage VRL, the output signal of the differential amplifier AMP1 is activated to the low level. Moreover, since the activating signal ACT is activated, the differential amplifiers AMP1 and AMP2 operate with a large bias current. In the activation period of the activating signal ACT, the CMOS switch MSW1 of the switch circuit SW1 is turned on, and thus the output terminal PO of the differential amplifier AMP1 and the gate of the pMOS transistor T3 are electrically connected to each other. For this reason, in accordance with the activation of the output signal of the differential amplifier AMP1, both the pMOS transistors T1 and T3 are turned on. Accordingly, the supply of a current starts between the output node ND and the restoring voltage line VBLH through both the pMOS transistors T1 and T3. Accordingly, the output voltage VPR starts to rise. Then, if the output voltage VPR becomes higher than the reference voltage VRL, the output signal of the differential amplifier AMP1 is inactivated to the high level. If doing so, the pMOS transistors T1 and T3 are turned off, and then the supply of the current stops between the output node ND and the restoring voltage line VBLH.

On the other hand, if the output voltage VPR becomes higher than the reference voltage VRH, the output signal of the differential amplifier AMP2 is activated to the high level. In the activation period of the activating signal ACT, the CMOS switch MSW1 of the switch circuit SW2 is turned on, and thus the output terminal PO of the differential amplifier AMP2 and the gate of the nMOS transistor T4 are electrically connected to each other. For this reason, in accordance with the activation of the output signal of the differential amplifier AMP2, both the nMOS transistors T2 and T4 are turned on. Therefore, the supply of a current starts between the output node ND and the ground line VSS through both the nMOS transistors T2 and T4. Accordingly, the output voltage VPR starts to fall. Then, if the output voltage VPR becomes lower than the reference voltage VRH, the output signal of the differential amplifier AMP2 is inactivated to the low level. If doing so, the nMOS transistors T2 and T4 are turned off, and then the supply of the current stops between the output node ND and the ground line VSS.

Figure 6:
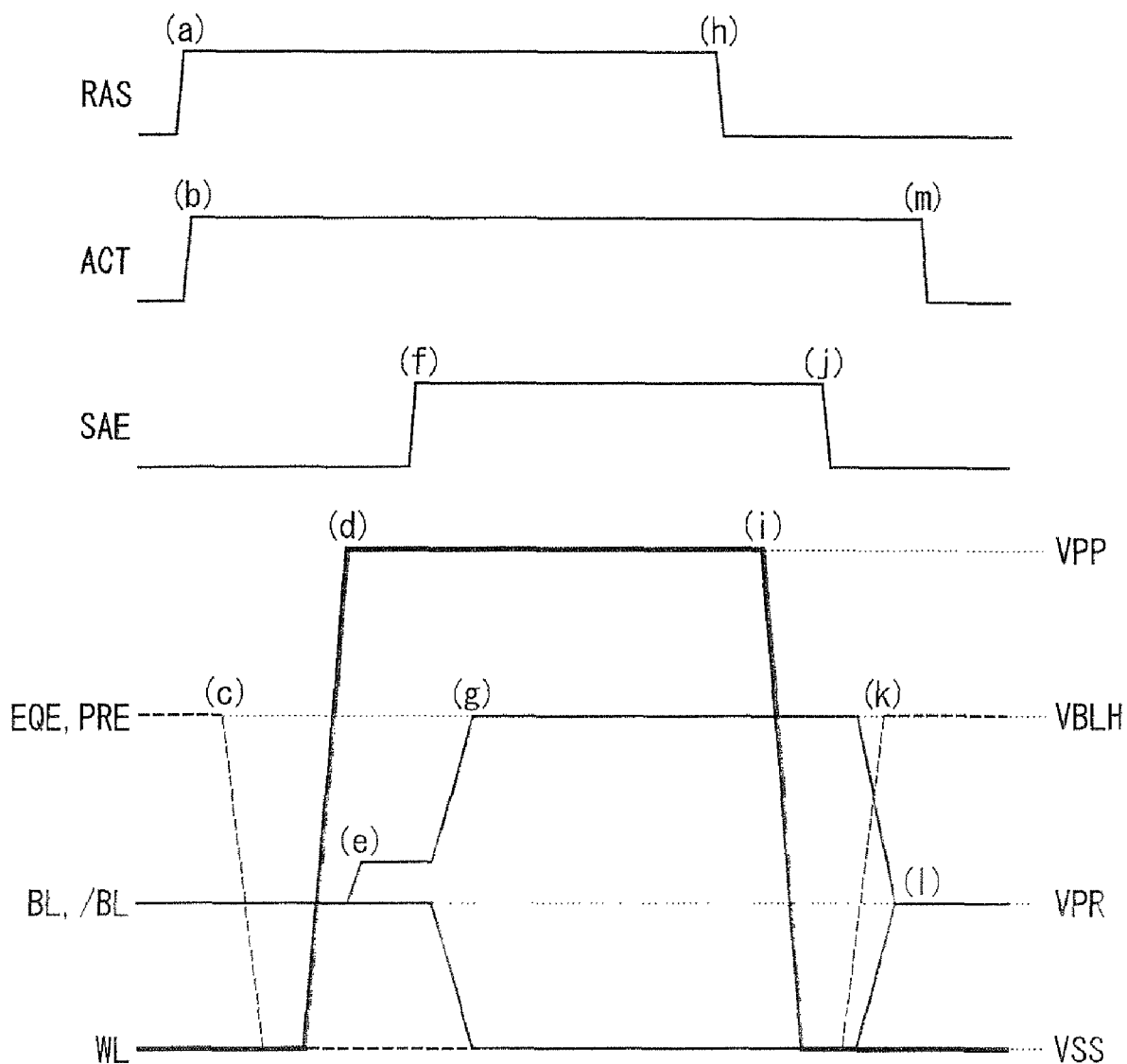
FIG. 6 is a timing chart showing an example of an operation of a semiconductor memory of FIG. 1.

FIG. 6 shows an example of the operation of the semiconductor memory of FIG. 1. In order to change the semiconductor memory 10 from the standby state to the active state, the row address strobe signal RAS is activated from the low level to the high level ((a) in FIG. 6). In accordance with the activation timing of the row address strobe signal RAS, the activating signal ACT is activated from the low level to the high level ((b) in FIG. 6). Accordingly, drivability of the voltage supply circuit 21 for a precharging voltage is increased. Further, in accordance with the activation of the row address strobe signal RAS, the equalizing control signal EQE and the precharging control signal PRE are inactivated from the high level (voltage VBLH) to the low level (voltage VSS) ((c) in FIG. 6). Accordingly, the nMOS transistor constituting the equalizing circuit EQC and the pair of nMOS transistors constituting the precharging circuit PRC are turned off. Subsequently, the word line WL is activated from the low level (voltage VSS) to the high level (voltage VPP) ((d) in FIG. 6). In accordance with the activation of the word line WL, the potential difference occurs in the pair of bit lines BL and /BL due to the electric charge accumulated in the memory cell MC ((e) in FIG. 6). Then, the sense amplifier control signal SAE is activated from the low level to the high level ((f) in FIG. 6). In response to the activation of the sense amplifier control signal SAE, the sense amplifier SA amplifies the potential difference of the pair of bits lines BL and /BL, and thus the voltages of the bit lines BL and /BL are set to the restoring voltage VBLH and the ground voltage VSS, respectively ((g) in FIG. 6).

Subsequently, in order to change the semiconductor memory 10 from the active state to the standby state, the row address strobe signal RAS is inactivated from the high level to the low level ((h) in FIG. 6). In accordance with the inactivation of the row address strobe signal RAS, the word line WL is inactivated from the high level to the low level ((i) in FIG. 6). Then, the sense amplifier control signal SAE is inactivated from the high level to the low level ((j) in FIG. 6). Subsequently, the equalizing control signal EQE and the precharging control signal PRE are activated from the low level to the high level ((k) in FIG. 6). Accordingly, the nMOS transistor constituting the equalizing circuit EQC and the pair of nMOS transistors constituting the precharging circuit PRC are turned on. Therefore, both the voltages of the bit lines BL and /BL are set to the precharging voltage VPR ((l) in FIG. 6). In accordance with a timing at which both the voltages of the bit lines BL and /BL are set to the voltage VPR, the activating signal ACT is inactivated from the high level to the low level ((m) of FIG. 6). Accordingly, drivability of the voltage supply circuit 21 for a precharging voltage is decreased.

As described above, in the voltage supply circuit 21 for a precharging voltage, drivability is increased in the activation period of the activating signal ACT, and is decreased in the inactivation period of the activating signal ACT. For this reason, for example, when the precharging voltage VPR is set to be lower than a half of the restoring voltage VBLH, and the current which has to be supplied by the voltage supply circuit 21 in a precharging operation after a restoring operation is temporarily increased, drivability required for the voltage supply circuit 21 is obtained.

Figure 7:
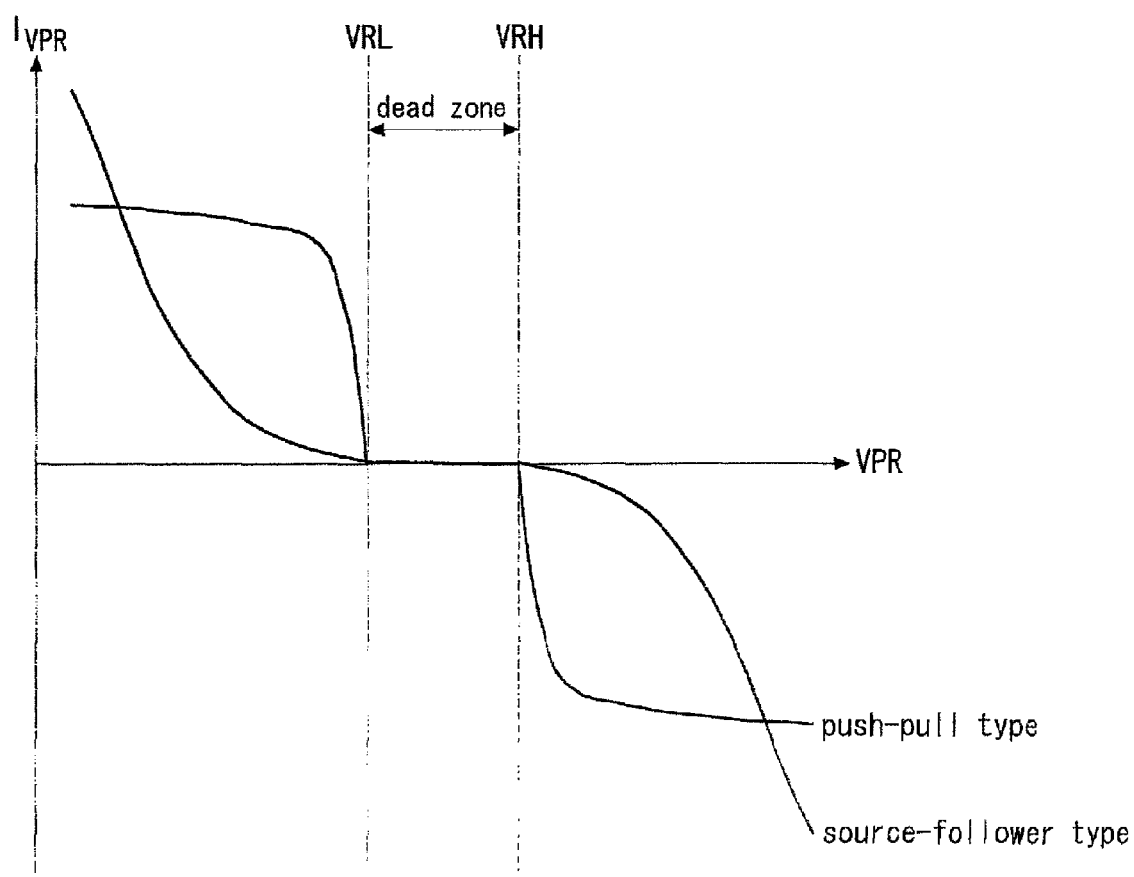
FIG. 7 is a diagram illustrating output characteristics of the voltage supply circuit.

FIG. 7 shows output characteristics of the voltage supply circuit. In FIG. 7, a vertical axis represents an output current $I_{VPR}$, and a horizontal axis represents the output voltage VPR. In the push-pull-type voltage supply circuit, a change of an output current in a voltage region neighboring to a dead zone (a voltage region between the reference voltages VRL and VRH) is precipitous, as compared with a source-follower-type voltage supply circuit. Accordingly, in the push-pull-type voltage supply circuit, the change of the output voltage VPR depending on the output current is little, as compared with the source-follower-type voltage supply circuit. Further, in the push-pull-type voltage supply circuit, there is no case in which the output voltage is influenced by the threshold voltages of output transistors, unlike the source-follower-type voltage supply circuit. Accordingly, in the push-pull-type voltage supply circuit, the output voltage VPR can be set with high precision, as compared with the source-follower-type voltage supply circuit. Since the voltage supply circuit 21 for a precharging voltage shown in FIG. 3 is a push-pull type, the above-described advantages are obtained.

Figure 8:
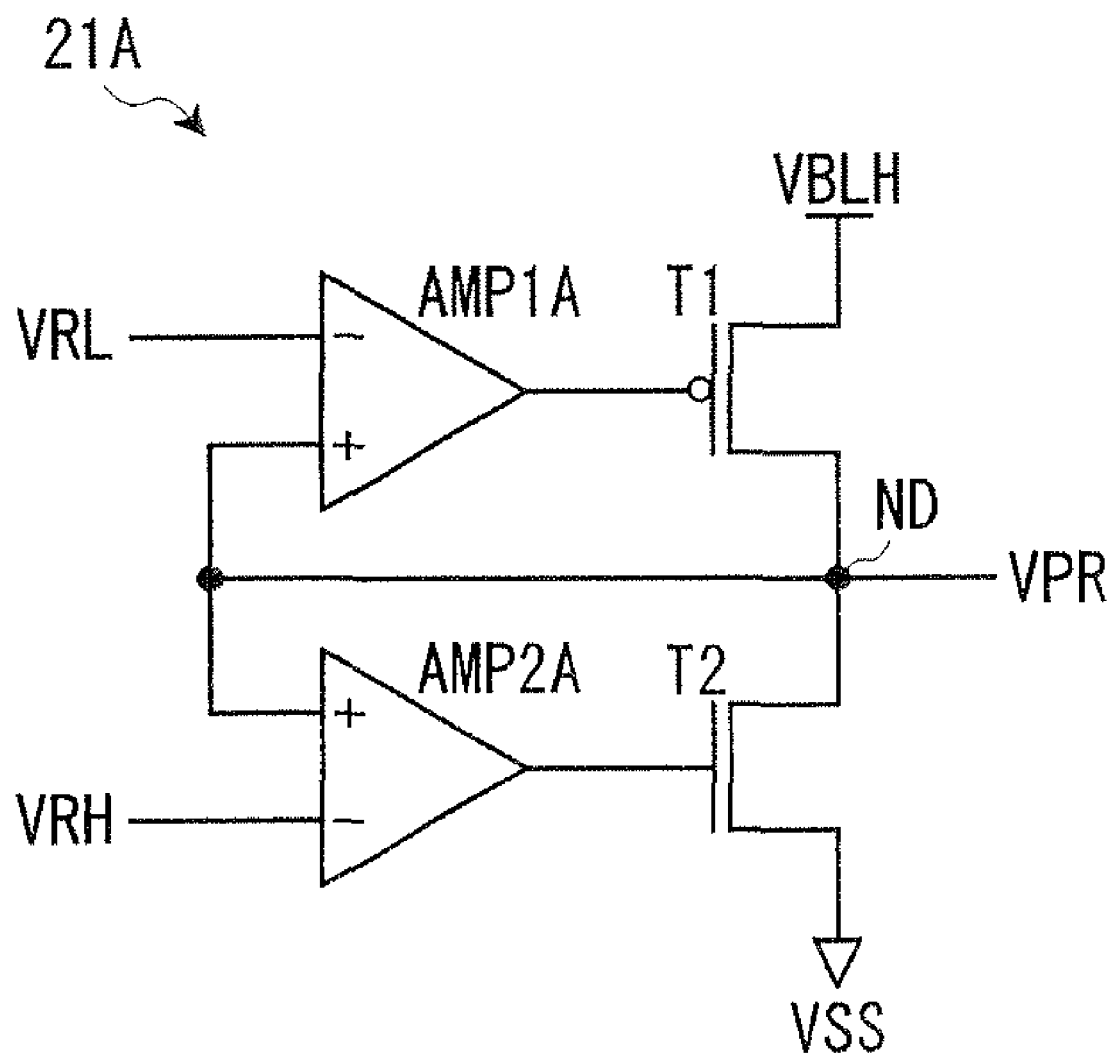
FIG. 8 is a circuit diagram showing a comparative example of the invention.
Figure 9:
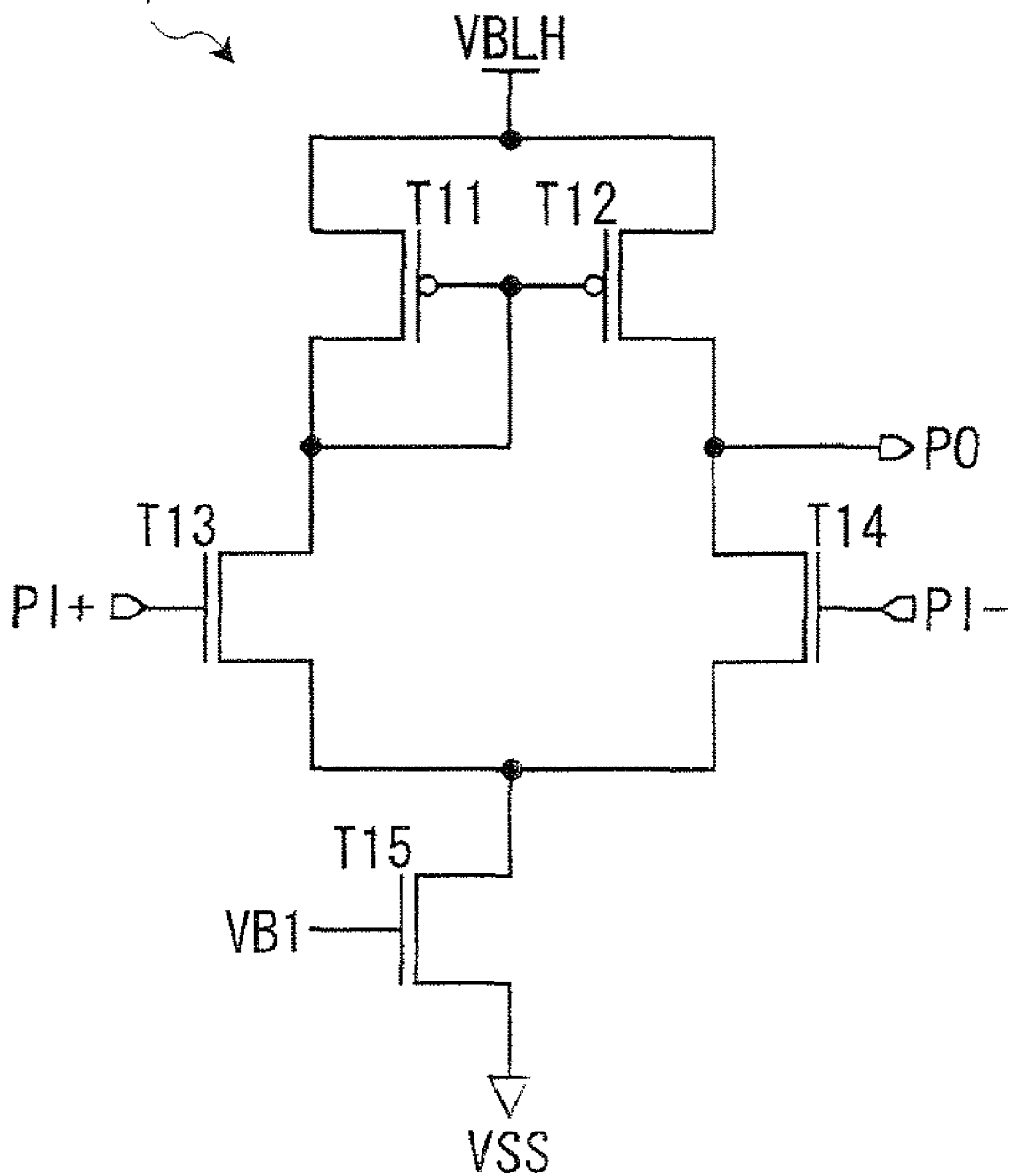
FIG. 9 is a circuit diagram showing differential amplifiers of FIG. 8.

FIG. 8 shows a comparative example of the invention. FIG. 9 shows differential amplifiers of FIG. 8. In the description of the comparative example, the same parts as those described with reference to FIGS. 1 to 5 are designated by the same reference numerals, and the detailed descriptions thereof will be omitted. A semiconductor memory in the comparative example has the same configuration as that of the semiconductor memory 10 of FIG. 1, except that, for example, a voltage supply circuit 21A of FIG. 8, instead of the voltage supply circuit 21, is provided.

In FIG. 8, the voltage supply circuit 21A for a precharging voltage is a push-pull-type voltage supply circuit, and has differential amplifiers AMP1A and AMP2A, a pMOS transistor T1, and an nMOS transistor T2. As shown in FIG. 9, each of the differential amplifiers AMP1A and AMP2A has pMOS transistors T11 and T12 and nMOS transistors T13 to T15. That is, each of the differential amplifiers AMP1A and AMP2A has the same configuration as that of each of the differential amplifiers AMP1 and AMP2 of FIG. 4, except that the nMOS transistors T16 and T17 are not provided.

In FIG. 8, the differential amplifier AMP1A receives the output voltage VPR through the non-inverting input terminal PI+, and simultaneously receives the reference voltage VRL through the inverting input terminal PI−. Therefore, the output signal of the differential amplifier AMP1A is activated to the low level when the output voltage VPR is lower than the reference voltage VRL. Further, the differential amplifier AMP2A receives the output voltage VPR through the non-inverting input terminal PI+, and simultaneously receives the reference voltage VRH through the inverting input terminal PI−. Therefore, the output signal of the differential amplifier AMP2A is activated to the high level when the output voltage VPR is higher than the reference voltage VRH.

The drain of the pMOS transistor T1 is connected to the output node ND, which is connected to the precharging voltage line VPR. The source of the pMOS transistor T1 is connected to the restoring voltage line VBLH. The gate of the pMOS transistor T1 is connected to the output terminal PO of the differential amplifier AMP1A. The drain of the nMOS transistor T2 is connected to the output node ND. The source of the nMOS transistor T2 is connected to the ground line VSS. The gate of the nMOS transistor T2 is connected to the output terminal PO of the differential amplifier AMP2A.

In the voltage supply circuit 21A for a precharging voltage having such a configuration, in order to increase drivability, it is preferable to increase the channel widths of the pMOS transistor T1 and the nMOS transistor T2. In this case, however, load capacitance of the output terminal PO of each of the differential amplifiers AMP1A and AMP2A is increased. For this reason, the response speed against the change of the output voltage VPR is lowered. Further, in the push-pull-type voltage supply circuit 21A, a feedback loop is formed by a two-stage amplification circuit. Accordingly, if the channel widths of the pMOS transistor T1 and the nMOS transistor T2 are increased, a phase margin is decreased, and thus stability against oscillation is lowered. The lowering of the response speed against the change of the output voltage VPR and the lowering of stability against oscillation can be avoided by increasing the bias current of each of the differential amplifiers AMP1A and AMP2A. However, if the bias current of each of the differential amplifiers AMP1A and AMP2A is constantly increased regardless of the operation state of the semiconductor memory, power consumption in the standby state of the semiconductor memory is increased.

On the other hand, in the voltage supply circuit 21 for a precharging voltage shown in FIG. 3, in the activation period of the activating signal ACT, the pMOS transistor T3 and the nMOS transistor T4 having large channel widths also are valid, in addition to the pMOS transistor T1 and the nMOS transistor T2. In the activation period of the activating signal ACT, in the differential amplifiers AMP1 and AMP2, since the nMOS transistor T17 is valid as the current source, in addition to the nMOS transistor T15, the bias current is increased, and the bias voltage VB2 to the nMOS transistor T17 is set to be higher than the bias voltage VB1 to the nMOS transistor T15. Therefore, the response speed against the change of the output voltage VPR and stability against the oscillation can be ensured.

Further, in the inactivation period of the activating signal ACT, the CMOS switch MSW1 of the switch circuit SW1 is turned off, and thus the output terminal PO of the differential amplifier AMP1 is electrically disconnected from the gate of the pMOS transistor T3. Similarly, in the inactivation period of the activating signal ACT, the CMOS switch MSW1 of the switch circuit SW2 is turned off, and thus the output terminal PO of the differential amplifier AMP2 is electrically disconnected from the gate of the nMOS transistor T4. Therefore, the response speed against the change of the output voltage VPR in the inactivation period of the activating signal ACT can be prevented from being lowered due to the pMOS transistor T3 and the nMOS transistor T4.

In addition, in the inactivation period of the activating signal ACT, since the bias current of each of the differential amplifiers AMP1 and AMP2 is decreased, power consumption in the standby state of the semiconductor memory 10 can be avoided from being increased. Further, since the pMOS transistor T5 and the nMOS transistor T6 are provided, a leak current in the inactivation period of the activating signal ACT can be reduced, and thus power consumption in the standby state of the semiconductor memory 10 can be reduced.

Figure 10:
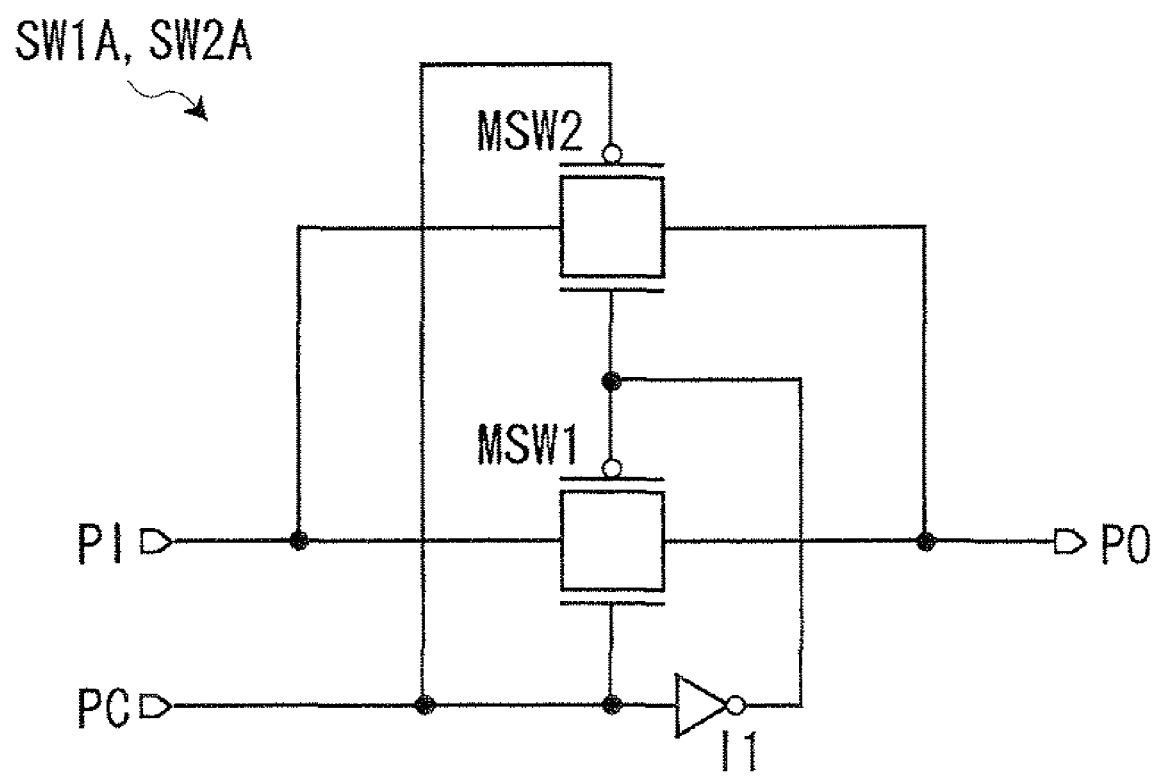
FIG. 10 is a circuit diagram showing a second embodiment of the invention.

FIG. 10 shows a second embodiment of the invention. In the description of the second embodiment, the same parts as those described in the first embodiment are designated by the same reference numerals and the detailed descriptions thereof will be omitted. A semiconductor memory of the second embodiment has the same configuration as that of the semiconductor memory 10 of FIG. 1, for example, except that switch circuits SW1A and SW2A of FIG. 10 are provided, instead of the switch circuits SW1 and SW2. Each of the switch circuits SW1A and SW2A has CMOS switches MSW1 and MSW2 (first and second switches), and an inverter I1. That is, each of the switch circuits SW1A and SW2A has the same configuration as that of each of the switch circuits SW1 and SW2 of FIG. 5, except that the CMOS switch MSW2 is further provided.

The CMOS switch MSW2 is connected in parallel with the CMOS switch MSW1 between the input terminal PI and the output terminal PO. A gate of a pMOS transistor constituting the CMOS switch MSW2 is connected to the control terminal PC. A gate of an nMOS transistor constituting the CMOS switch MSW2 is connected to the output of the inverter I1. Moreover, impedance of the CMOS switch MSW2 is sufficiently higher than impedance of the CMOS switch MSW1.

In such a circuit configuration, when the input signal to the control terminal PC is set to the high level, the CMOS switch MSW1 is turned on, and thus the input terminal PI and the output terminal PO are electrically connected to each other. On the other hand, when the input signal to the control terminal PC is set to the low level, the CMOS switch MSW2 is turned on, and thus the input terminal PI and the output terminal PO are electrically connected to each other to an extremely weak extent.

Therefore, in the voltage supply circuit for a precharging voltage according to the second embodiment, in the inactivation period of the activating signal ACT, the output terminal PO of the differential amplifier AMP1 and the gate of the pMOS transistor T3 are electrically connected to each other to an extremely weak extent (to an extent that gate capacitance of the pMOS transistor T3 is negligible as load capacitance of the output terminal PO of the differential amplifier AMP1). For this reason, when the inactivation period of the activating signal ACT extends, the voltage of the gate of the pMOS transistor T3 is avoided from being apart from the voltage of the output terminal PO of the differential amplifier AMP1. Similarly, in the inactivation period of the activating signal ACT, the output terminal PO of the differential amplifier AMP2 and the gate of the nMOS transistor T4 are electrically connected to each other to an extremely weak extent (to an extent that gate capacitance of the nMOS transistor T4 is negligible as load capacitance of the output terminal PO of the differential amplifier AMP2). For this reason, when the inactivation period of the activating signal ACT extends, the voltage of the gate of the nMOS transistor T4 is avoided from being apart from the voltage of the output terminal PO of the differential amplifier AMP2.

In the second embodiment described above, the same effects as those in the first embodiment are also obtained. Further, when the inactivation period of the activating signal ACT extends, the voltage of the gate of the pMOS transistor T3 can be avoided from being apart from the voltage of the output terminal PO of the differential amplifier AMP1, and the voltage of the gate of the nMOS transistor T4 can be avoided from being apart from the voltage of the output terminal PO of the differential amplifier AMP2. For this reason, the response speed against the change of the output voltage VPR just after the activation of the activating signal ACT can be enhanced, as compared with the first embodiment.

Figure 11:
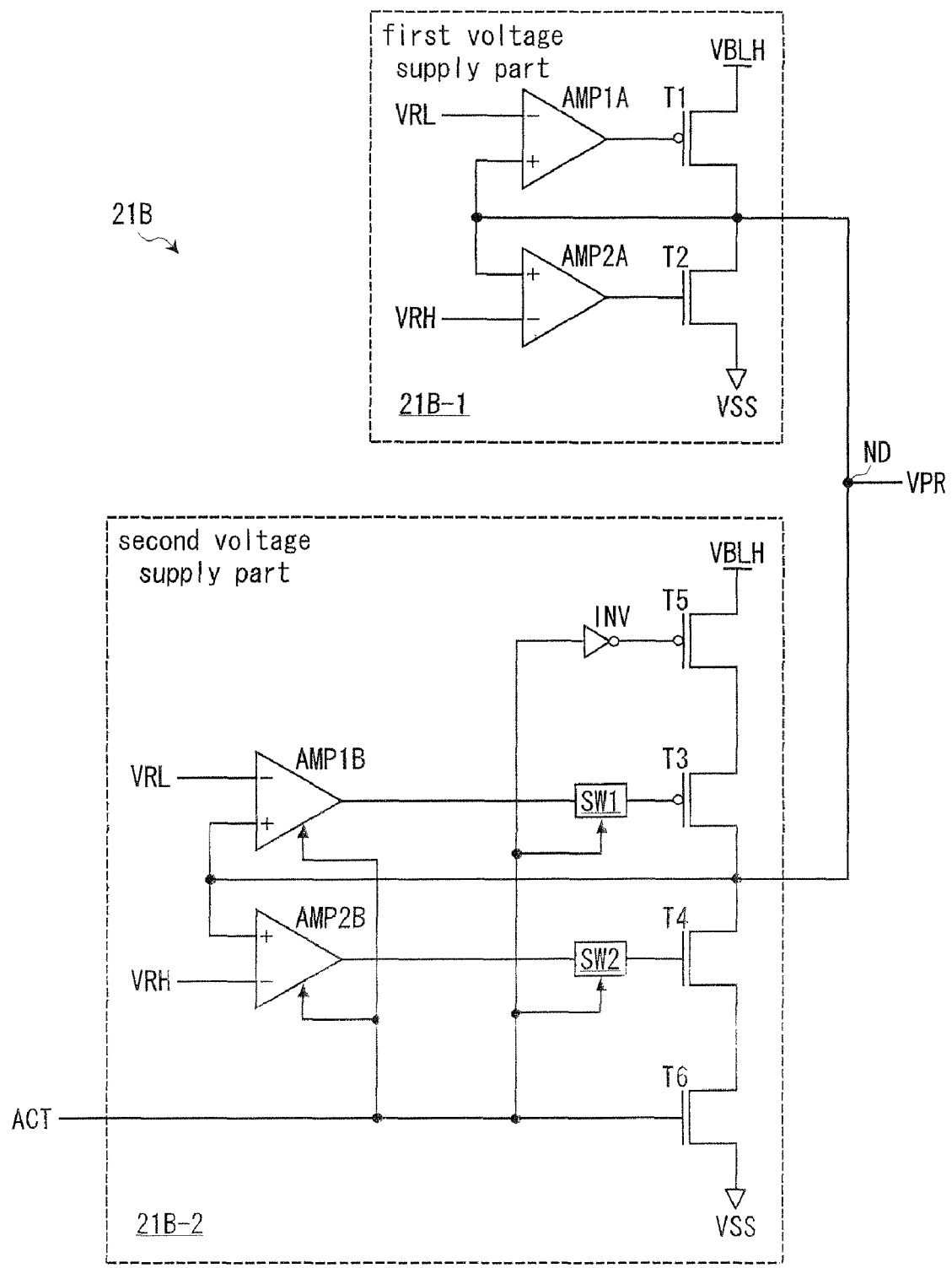
FIG. 11 is a circuit diagram showing a third embodiment of the invention.
Figure 12:
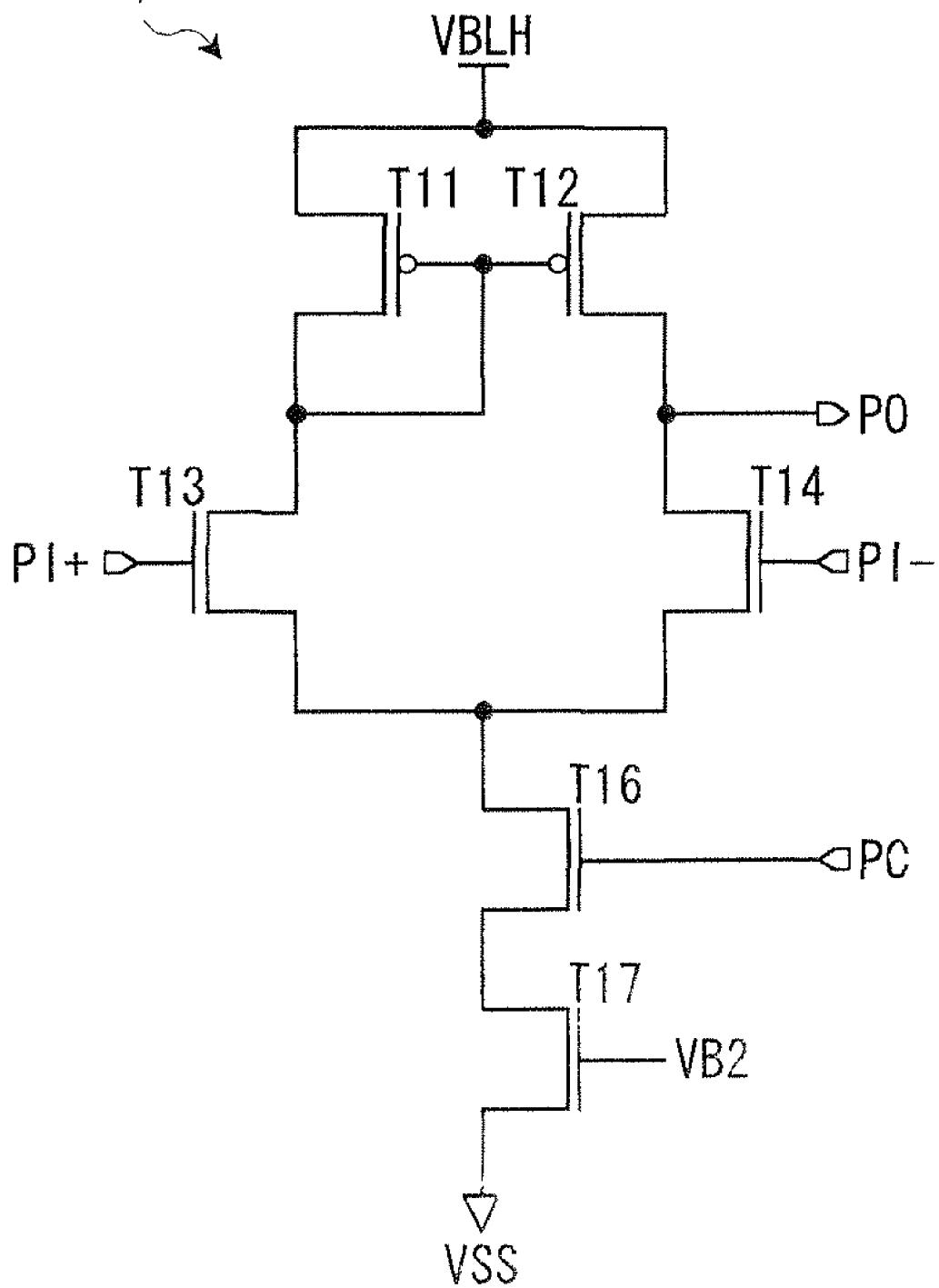
FIG. 12 is a circuit diagram showing differential amplifiers of a second voltage supply part of FIG. 11.

FIG. 11 shows a third embodiment of the invention. FIG. 12 shows differential amplifiers of a second voltage supply part of FIG. 11. In the description of the third embodiment, the same parts as those described in the first embodiment are designated by the same reference numerals and the detailed descriptions thereof will be omitted. A semiconductor memory of the third embodiment has the same configuration as that of the semiconductor memory of FIG. 1, for example, except that a voltage supply circuit 21B of FIG. 11 is provided, instead of the voltage supply circuit 21.

The voltage supply circuit 21B for a precharging voltage has a first voltage supply part 21B-1 that constantly operates regardless of the activating signal ACT, and a second voltage supply part 21B-2 that operates only in the activation period of the activating signal ACT. The first voltage supply part 21B-1 has differential amplifiers AMP1A and AMP2A (first and second differential amplifiers), and a pMOS transistor T1 and an nMOS transistor T2 (first driving circuit). That is, the first voltage supply part 21B-1 has the same configuration as that of the voltage supply circuit 21A of FIG. 8. The second voltage supply part 21B-2 has differential amplifiers AMP1B and AMP2B (third and fourth differential amplifiers), switch circuits SW1 and SW2, and PMOS transistors T3 and T5 and nMOS transistors T4 and T6 (second driving circuit). That is, the second voltage supply part 21B-2 has the same configuration as that of the voltage supply circuit 21 of FIG. 3, except that the pMOS transistor T1 and the nMOS transistor T2 are not provided and the differential amplifiers AMP1B and AMP2B are provided, instead of the differential amplifiers AMP1 and AMP2.

As shown in FIG. 12, each of the differential amplifiers AMP1B and AMP2B has pMOS transistors T11 and T12, and nMOS transistors T13, T14, T16, and T17. That is, each of the differential amplifiers AMP1B and AMP2B has the same configuration as that of each of the differential amplifiers AMP1 and AMP2 of FIG. 4, except that the nMOS transistor T15 is not provided. The connection node of the pMOS transistor T1 and the nMOS transistor T2 in the first voltage supply part 21B-1, and the connection node of the pMOS transistor T3 and the nMOS transistor T4 in the second voltage supply part 21B-2 are connected to the output node ND, which is connected to the precharging voltage line VPR. Hereinafter, the operation of the voltage supply circuit 21B having such a configuration will be described while being divided into the inactivation period and the activation period of the activating signal ACT.

(Inactivation Period of Activating Signal Act)

In the inactivation period of the activating signal ACT, the second voltage supply part 21B-2 does not operate. For this reason, if the output voltage VPR becomes lower than the reference voltage VRL, only the output signal of the differential amplifier AMP1A is activated to the low level, and then only the pMOS transistor T1 is turned on. Therefore, the supply of a current starts between the output node ND and the restoring voltage line VBLH only through the pMOS transistor T1. Accordingly, the output voltage VPR starts to rise. Then, if the output voltage VPR becomes higher than the reference voltage VRL, the output signal of the differential amplifier AMP1A is inactivated to the high level. If doing so, the pMOS transistor T1 is turned off, and then the supply of the current stops between the output node ND and the restoring voltage line VBLH.

On the other hand, if the output voltage VPR becomes higher than the reference voltage VRH, only the output signal of the differential amplifier AMP2A is activated to the high level, and then only the nMOS transistor T2 is turned on. Therefore, the supply of a current starts between the output node ND and the ground line VSS only through the nMOS transistor T2. Accordingly, the output voltage VPR starts to fall. Then, if the output voltage VPR becomes lower than the reference voltage VRH, the output signal of the differential amplifier AMP2A is inactivated to the low level. If doing so, the nMOS transistor T2 is turned off, and then the supply of the current stops between the output node ND and the ground line VSS.

(Activation Period of Activating Signal Act)

In the activation period of the activating signal ACT, the second voltage supply part 21B-2 operates. For this reason, if the output voltage VPR becomes lower than the reference voltage VRL, both the output signal of the differential amplifier AMP1A and the output signal of the differential amplifier AMP1B are activated to the low level, and then both the pMOS transistors T1 and T3 are turned on. Therefore, the supply of the current starts between the output node ND and the restoring voltage line VBLH through both the pMOS transistors T1 and T3. Accordingly, the output voltage VPR starts to rise. Then, if the output voltage VPR becomes higher than the reference voltage VRL, the output signal of the differential amplifier AMP1A and the output signal of the differential amplifier AMP1B are inactivated to the high level. If doing so, the pMOS transistors T1 and T3 are turned off, and then the supply of the current stops between the output node ND and the restoring voltage line VBLH.

On the other hand, if the output voltage VPR becomes higher than the reference voltage VRH, both the output signal of the differential amplifier AMP2A and the output signal of the differential amplifier AMP2B are activated to the high level, and then both the nMOS transistors T2 and T4 are turned on. Therefore, the supply of the current starts between the output node ND and the ground line VSS through both the nMOS transistors T2 and T4. Accordingly, the output voltage VPR starts to fall. Then, if the output voltage VPR becomes lower than the reference voltage VRH, the output signal of the differential amplifier AMP2A and the output signal of the differential amplifier AMP2B are inactivated to the low level. If doing so, the nMOS transistors T2 and T4 are turned off, and then the supply of the current stops between the output node ND and the ground line VSS.

As such, in the activation period of the activating signal ACT, both the first voltage supply part 21B-1 having small drivability and the second voltage supply part 21B-2 having large drivability operate, and thus drivability of the entire voltage supply circuit 21B is increased. On the other hand, in the inactivation period of the activating signal ACT, only the first voltage supply part 21B-1 having small drivability operates, and thus drivability of the entire voltage supply circuit 21B is decreased. For this reason, for example, when the precharging voltage VPR is set to be lower than a half of the restoring voltage VBLH, and the current which has to be supplied by the voltage supply circuit 21B in the precharging operation after the restoring operation is temporarily increased, drivability required for the voltage supply circuit 21B is obtained.

Further, since the bias voltage VB2 is set to be higher than the bias voltage VB1, the bias current of each of the differential amplifiers AMP1B and AMP2B in the second voltage supply part 21B-2 becomes larger than the bias current of each of the differential amplifiers AMP1A and AMP2A in the first voltage supply part 21B-1. For this reason, in the second voltage supply part 21B-2 that includes the pMOS transistors T3 and T5 and the nMOS transistors T4 and T6 having the large channel widths, the response speed against the change of the output voltage VPR and stability against the oscillation are ensured. In the third embodiment described above, the same effects as those in the first embodiment are also obtained.

Figure 13:
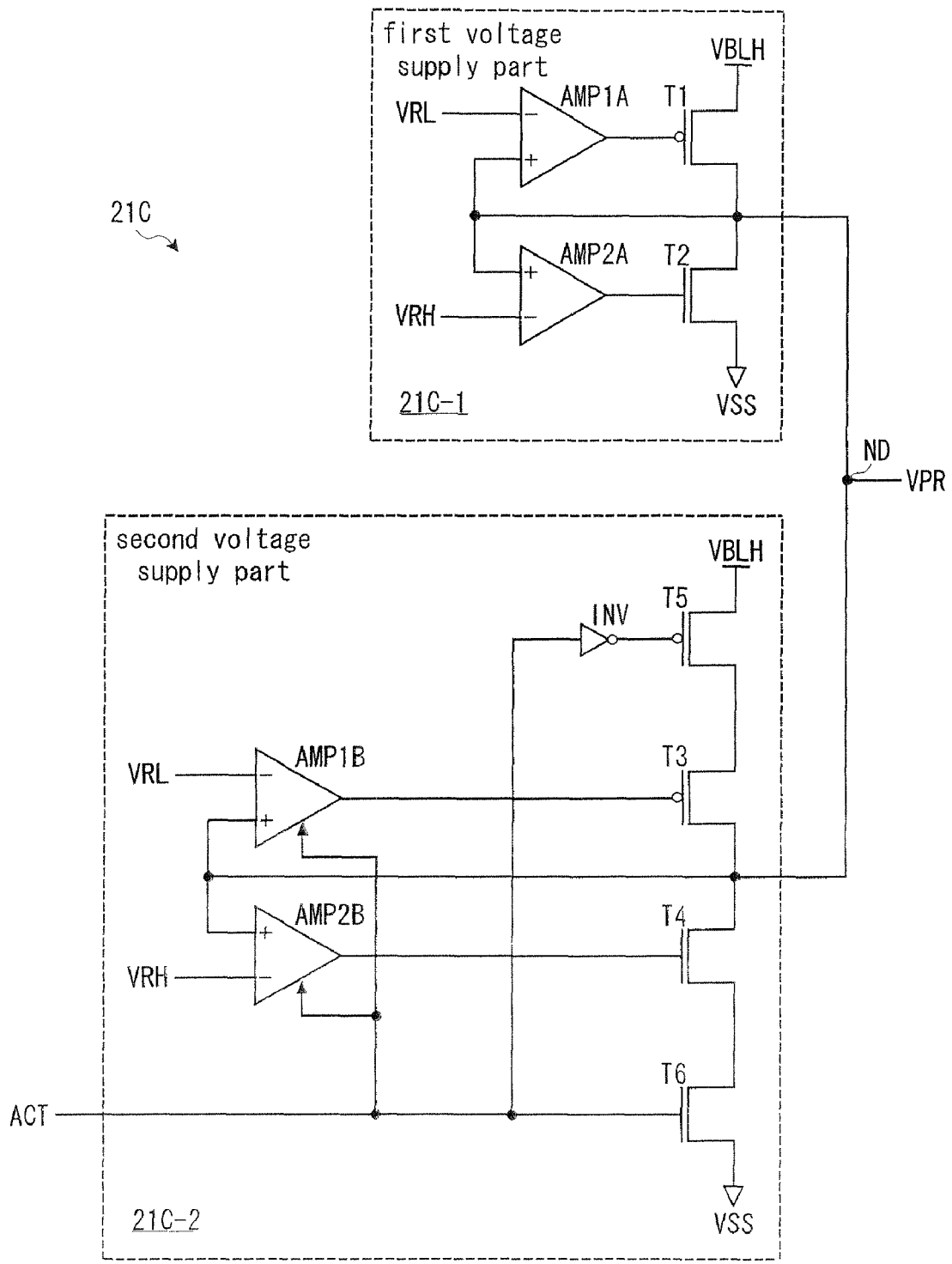
FIG. 13 is a circuit diagram showing a fourth embodiment of the invention.

FIG. 13 shows a fourth embodiment of the invention. In the description of the fourth embodiment, the same parts as those in the first and third embodiments are designated by the same reference numerals and the detailed descriptions thereof will be omitted. A semiconductor memory of the fourth embodiment has the same configuration as that of the semiconductor memory 10 of FIG. 1, for example, except that a voltage supply circuit 21C of FIG. 13 is provided, instead of the voltage supply circuit 21. The voltage supply circuit 21C for a precharging voltage has a first voltage supply part 21C-1 that constantly operates regardless of the activating signal ACT, and a second voltage supply part 21C-2 that operates only in the activation period of the activating signal ACT.

The first voltage supply part 21C-1 has the same configuration as that of the first voltage supply part 21B-1 of FIG. 11 (that is, the voltage supply circuit 21A of FIG. 8). The second voltage supply part 21C-2 has the same configuration as that of the second voltage supply part 21B-2 of FIG. 11, except that the switch circuits SW1 and SW2 are not provided. The connection node of the pMOS transistor T1 and the nMOS transistor T2 in the first voltage supply part 21C-1, and the connection node of the pMOS transistor T3 and the nMOS transistor T4 in the second voltage supply part 21C-2 are connected to the output node ND, which is connected to the precharging voltage line VPR. In the fourth embodiment described above, the same effects as those in the first embodiment are obtained.

Moreover, though the example in which the invention is applied to the DRAM has been described in the first to fourth embodiments, the invention is not limited to these embodiments. For example, the invention may be applied to a pseudo SRAM (Static Random Access Memory) in which the DRAM memory cells and an SRAM interface are provided. Though the example in which the invention is applied to the voltage supply circuit for a precharging circuit has been described in the first to fourth embodiments, the invention is not limited to this embodiment. For example, the invention may be applied to a voltage supply circuit for a plate voltage.

Further, though the example in which the voltage supply circuit for a precharging voltage has the two switch circuits has been described in the first embodiment, the invention is not limited to this embodiment. For example, the voltage supply circuit for a precharging voltage may be constituted while the two switch circuits are omitted. In this case, the response speed against the change of the output voltage and stability against the oscillation can be ensured, without increasing power consumption in the standby state of the semiconductor memory. Further, drivability of the voltage supply circuit for a precharging voltage can be controlled according to the operation state of the semiconductor memory. Though the example in which the second switch is constituted by the CMOS switch having the pMOS transistor and the nMOS transistor has been described in the second embodiment, the invention is not limited to this embodiment. For example, the second switch may be constituted by the pMOS transistor or the nMOS transistor.

The invention is not limited to the above embodiments and various modifications may be made without departing from the spirit and scope of the invention. Any improvement may be made in part or all of the components.

What is claimed is:

1. A method of generating a voltage at an output node, comprising:
    activating a first driving circuit, in a first mode and a second mode, to supply a high voltage to the output node when the voltage is lower than a first voltage and to supply a low voltage to the output node when the voltage is higher than a second voltage; and
    activating a second driving circuit, in the second mode, to supply the high voltage to the output node when the voltage is lower than the first voltage and to supply the low voltage to the output node when the voltage is higher than the second voltage.

2. The method according to claim 1, wherein the first mode is a stand-by state of a circuit to which the voltage is supplied, and the second mode is an active state of the circuit.

3. The method according to claim 1, further comprising:
    comparing the voltage with the first voltage to generate a first comparison result;
    comparing the voltage with the second voltage to generate a second comparison result; and
    activating the first driving circuit based on the first comparison result or the second comparison result in the first mode and the second mode.

4. The method according to claim 1, wherein the second driving circuit is activated based on an active signal which indicates one of the first mode and the second mode.

5. The method according to claim 1, further comprising:
    supplying the voltage to a pre-charge circuit.

6. The method according to claim 1, wherein the second voltage is higher than the first voltage.

7. The method according to claim 1, wherein the second driving circuit is not activated in the first mode.

8. A method of generating a voltage at output node to supply the voltage to a circuit, comprising:
    supplying a high voltage to an output node via a first path when detecting that the voltage is lower than a first voltage;
    supplying a low voltage to the output node via a second path when detecting that the voltage is higher than a second voltage;
    supplying the high voltage to the output node via a third path, which is different from the first path, when detecting that the voltage is lower than a first voltage; and
    supplying the low voltage to the output node via the fourth path, which is different from the third path, when detecting that the voltage is higher than a second voltage,
    wherein the first path and the second path are used in a first mode and a second mode,
    wherein the third mode and the fourth mode are used in the second mode.

9. The method according to claim 8, wherein the first mode is a stand-by state of the circuit and the second mode is an activate state of the circuit.

10. The method according to claim 8, wherein the first path is from a high voltage supply line to the output node via a first circuit,
    wherein the second path is from a low voltage supply line to the output node via a second circuit.

11. The method according to claim 8, wherein the second voltage is higher than the first voltage.

12. The method according to claim 8, wherein the third path and the fourth path are not used in the first mode.

* * * * *